United States Patent
Fujimoto et al.

(10) Patent No.: US 7,309,624 B2
(45) Date of Patent: Dec. 18, 2007

(54) SEMICONDUCTOR DEVICE AND METHOD FOR THE FABRICATION THEREOF INCLUDING GRINDING A MAJOR PORTION OF THE FRAME

(75) Inventors: Hiroaki Fujimoto, Osaka (JP); Tsuyoshi Hamatani, Shiga (JP); Toru Nomura, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/484,683

(22) Filed: Jul. 12, 2006

(65) Prior Publication Data

US 2006/0252183 A1 Nov. 9, 2006

Related U.S. Application Data

(62) Division of application No. 11/042,163, filed on Jan. 26, 2005, now Pat. No. 7,125,751, which is a division of application No. 10/259,661, filed on Sep. 30, 2002, now abandoned, which is a division of application No. 09/745,412, filed on Dec. 26, 2000, now Pat. No. 6,498,393.

(30) Foreign Application Priority Data

Dec. 27, 1999 (JP) .............................. 11-369866

(51) Int. Cl.
*H01L 21/44* (2006.01)
*H01L 21/48* (2006.01)
*H01L 21/50* (2006.01)
*H01L 21/302* (2006.01)
*H01L 21/461* (2006.01)

(52) U.S. Cl. .................... 438/123; 438/124; 438/126; 438/692; 257/E23.043

(58) Field of Classification Search ............... 438/123, 438/124, 126, 692; 257/E23.043, E23.126
See application file for complete search history.

(56) References Cited

U.S. PATENT DOCUMENTS

| 4,722,765 A | 2/1988 | Ambros et al. |
| 4,961,105 A | 10/1990 | Yamamoto |
| 5,656,550 A | 8/1997 | Tsuji et al. |

(Continued)

FOREIGN PATENT DOCUMENTS

JP 11-186301 7/1999

(Continued)

*Primary Examiner*—William M. Brewster
(74) *Attorney, Agent, or Firm*—Nixon Peabody LLP; Donald R. Studebaker

(57) ABSTRACT

Disclosed is a semiconductor device which comprises a semiconductor element having a plurality of electrodes, a plurality of external electrodes disposed around the periphery of the semiconductor element, a fine wire electrically connected between at least one of surfaces of each of the plural external electrodes and at least one of the plural electrodes of the semiconductor element, and an encapsulating resin which encapsulates the semiconductor element, the plural external electrodes, and the fine wires and whose external shape is a rectangular parallelepiped, wherein a bottom surface of the semiconductor element and a bottom surface of each of the plural external electrode are exposed from a bottom surface of the encapsulating resin and a top surface of the semiconductor element and a top surface of each of the plural external electrode are located substantially coplanar with each other.

2 Claims, 19 Drawing Sheets

U.S. PATENT DOCUMENTS

| | | |
|---|---|---|
| 6,084,291 A | 7/2000 | Fujimori |
| 6,247,229 B1 | 6/2001 | Glenn |
| 6,291,271 B1 | 9/2001 | Lee et al. |
| 6,326,299 B1 | 12/2001 | Homma et al. |
| 6,395,580 B1 | 5/2002 | Tseng |
| 2001/0009301 A1* | 7/2001 | Azuma ................ 257/698 |
| 2002/0005576 A1* | 1/2002 | Sakamoto et al. .......... 257/687 |
| 2002/0105069 A1 | 8/2002 | Kawahara et al. |

FOREIGN PATENT DOCUMENTS

JP    11-195733    7/1999

* cited by examiner

PRIOR ART

PRIOR ART

SEMICONDUCTOR DEVICE AND METHOD FOR THE FABRICATION THEREOF INCLUDING GRINDING A MAJOR PORTION OF THE FRAME

BACKGROUND OF THE INVENTION

The present invention relates generally to a semiconductor device and to a method for the fabrication of such a semiconductor device. The present invention relates more particularly to an extremely thin semiconductor device of high packaging density type which is capable of coping with multipin (high pin count)-ization and to a method for the fabrication of such a low profile semiconductor device.

The recent trend that electronic equipment is toward becoming smaller and smaller in size requires the high packaging density of semiconductor components such as semiconductor devices of resin-encapsulated type, and semiconductor components are now becoming smaller in size and lower in profile. Further, multipin-ization is now advancing even for small size and thin (low profile) semiconductor devices. There have been placed demands for high-density, downsized, and thin semiconductor devices of the resin-encapsulated type.

Referring now to FIG. 15, a lead frame for a conventional semiconductor device will be described below.

FIG. 15 is a plan view showing a conventional lead frame structure. As shown, the conventional lead frame is made up of a frame portion 101, a rectangular die pad portion 102 within the frame portion 101 on which a semiconductor element will be mounted, a suspension lead portion 103 for supporting the die pad portion 102, a beam-like inner lead portion 104 which is electrically connected, when the semiconductor element is mounted on the die pad portion 102, to the mounted semiconductor element by a connection portion such as a metal fine wire, an outer lead portion 105, formed continuously with the inner lead portion 104, for establishing connection with an external terminal, and a tie bar portion 106 which interconnects and fixes together the outer lead portions 105 and which acts as a resin stopper during resin encapsulation.

Although in the lead frame of FIG. 15 only one pattern of the design of FIG. 15 is illustrated, practically a plurality of such patterns are arrayed laterally and vertically in succession.

Referring next to FIG. 16, a conventional semiconductor device will be described. FIG. 16 schematically depicts, in cross section, a semiconductor device of the resin encapsulation type making utilization of the lead frame of FIG. 15.

As shown in FIG. 16, a semiconductor element 107 is mounted on the die pad portion 102 of the lead frame. The semiconductor element 107 and the inner lead portion 104 are electrically connected together by a metal fine wire 108. The outer peripheries of the semiconductor element 107 on the die pad portion 102 and the inner lead portion 104 are encapsulated by an encapsulating resin 109. The outer lead portion 105 is so provided as to project outside a lateral surface of the encapsulating resin 109 with its end portion bent.

In a conventional semiconductor device fabrication method, the semiconductor element 107 is first bonded onto the die pad portion 102 of the lead frame by an adhesive (the die bond step), as shown in FIG. 17. Following the die bond step, the semiconductor element 107 and the tip of the inner lead portion 104 are connected together by the metal fine wire 108 (the wire bonding step). Thereafter, the outer peripheral of the semiconductor element 107 is subjected to encapsulation. In such encapsulation, the region encapsulated by the encapsulating resin 109 is surrounded by the tie bar portion 106 of the lead frame, while the outer lead portion 105 projects outside (the resin encapsulating step). Lastly, the boundary portion of the encapsulating resin 109 is subjected to cutting at the tie bar portion 106, the outer lead portions 105 are separated from each other, the frame portion 101 is removed, and the tip of the outer lead portion 105 is subjected to bending (the tie bar cut/bend step). In the way described above, the resin-encapsulated type semiconductor device of FIG. 16 can be fabricated. A broken line of FIG. 17 indicates the region to be encapsulated by the encapsulating resin 109.

The conventional lead frame configuration, however, suffers some problems when semiconductor elements are highly integralized and multipin-ized. There is the limit of reducing, when forming an inner lead portion (an outer lead portion), its width. Therefore, if the number of inner lead portions (outer lead portions) is increased with a view to coping with multipin-ization, this usually results in increasing the size of the lead frame itself. As a result, the dimensions of the semiconductor device also increase and it is hard to meet the demand for downsized, thin semiconductor devices. On the other hand, if the number of inner lead portions is increased to cope with semiconductor element multipin-ization without making an alteration in lead frame size, this requires that the width of each inner lead portion be reduced. This will produce many problems with processes such as etching used for lead frame formation.

Recently, as a surface-mount type semiconductor device, certain types of semiconductor devices have been developed (for example, Ball Grid Array (BGA)-type semiconductor devices and Land Grid Array (LGA)-type semiconductor devices). In such a type of semiconductor device, a semiconductor element is mounted on a carrier (a wiring board) having on its bottom surface an external electrode, electrical connections are established, and thereafter the top surface of the carrier is subjected to encapsulation. Such a type of semiconductor device is a semiconductor device onto which bottom surface a mother board is mounted. In future, semiconductor devices of the surface-mount type are expected to become a main stream of semiconductor devices. Accordingly, the problem that conventional lead frames and semiconductor devices making use of such conventional lead frames are unable to keep up with the trend toward the surface-mount type, is becoming serious.

In recent years, technologies for small size/thin packages have been proposed which use no die pad for element mounting. In such technologies, a semiconductor chip is reduced in thickness, electrodes are disposed around the chip, and the outer periphery is single-side encapsulated by encapsulating resin. However, such a single-side encapsulated package has the problem that electrodes are not efficiently exposed from the bottom surface of the encapsulating resin. Moreover, since the thickness is reduced, this produces another problem that stress, caused by encapsulating resin present between electrodes, is applied to these electrodes.

SUMMARY OF THE INVENTION

It is therefore an object of the present invention to provide an extremely thin semiconductor device capable of coping with multipin-ization.

The present invention provides a semiconductor device comprising:

a semiconductor element having a plurality of electrodes;

a plurality of external electrodes disposed around the periphery of the semiconductor element;

a fine wire electrically connected between at least one of surfaces of the plural external electrodes and at least one of the plural electrodes of the semiconductor element; and an encapsulating resin which encapsulates the semiconductor element, the plural external electrodes, and the fine wires and whose external shape is a rectangular parallelepiped;

wherein a bottom surface of the semiconductor element and a bottom surface of each of the plural external electrodes are exposed from a bottom surface of the encapsulating resin; and wherein a top surface of the semiconductor element and a top surface of each of the plural external electrodes are located substantially coplanar with each other.

It is preferable that depressed portions are formed in bottom surface areas of the semiconductor device defined between external electrodes of the plural external electrodes and between the semiconductor element and an external electrode of the plural external electrode, wherein the depressed portions are recessed inside the encapsulating resin.

It is preferable that the plural external electrodes are disposed, in double or more arrangement and in parallel with each other, around the outer periphery of the semiconductor element.

It is preferable that the semiconductor element and each of the plural external electrodes are substantially identical in thickness with each other.

It is preferable that the encapsulating resin is a permeable resin.

It is preferable that the fine wire is a metal fine wire which is surface insulated.

It is preferable that the total thickness of the semiconductor device is not more than 150 μm.

The present invention provides a method for the fabrication of a semiconductor device comprising the steps of:

(a) preparing a frame member;

the frame member including:

a plate-like frame major portion having a top surface and a bottom surface;

a plurality of electrode constituent portions which are projections formed on the top surface of the frame major portion; and an element housing portion located in a top surface area of the frame major portion surrounded by the plural electrode constituent portions, the element housing portion housing therein a semiconductor element to be fixed thereto;

(b) fixing to the element housing portion of the frame member the semiconductor element having a plurality of electrodes;

(c) after the step (b), electrically connecting by a fine wire between at least one of the plural electrodes of the semiconductor element and at least one of top surfaces of the plural electrode constituent portions;

(d) encapsulating, by a resin, a surface of the frame member on the side where the semiconductor element has been fixed to the element housing portion and has been electrically connected by the fine wire; and (e) after the step (d), grinding the frame major portion of the frame member such that the plural electrode constituent portions are separated from each other to become individual external electrodes, and exposing both a bottom surface of each of the plural external electrodes and a bottom surface of the semiconductor element from the resin.

It is preferable that the frame major portion of the frame member prepared in the step (a) is made of a metal plate or a conductive plate.

It is preferable that the frame member prepared in the step (a) has the plural electrode constituent portions each of which projects for substantially the same amount as the thickness of the semiconductor element to be fixed to the element housing portion.

It is preferable that the step (e) is carried out such that depressed portions recessed inside the resin are formed in surface areas of the resin, wherein the resin surface areas are defined between external electrodes of the plural external electrodes and between the semiconductor element and an external electrode of the plural external electrodes, and wherein the bottom surface of each of the plural external electrodes and the bottom surface of the semiconductor element are exposed from the resin.

It is preferable that the step (e) is carried out using a grinding member.

It is preferable that (i) the frame member prepared in the step (a) includes a plurality of the element housing portions, (ii) the step (b) is a step of fixing a plurality of the semiconductor elements to the plural element housing portions, respectively, and (iii) the method further comprises after the step (e) a step of subjecting the plural semiconductor elements to characteristic testing and, after the characteristic testing, a step of dividing the plural semiconductor elements into individual semiconductor device pieces, respectively.

The present invention provides a semiconductor device comprising:

a semiconductor element having a plurality of electrodes;

a plurality of external electrodes disposed around the periphery of the semiconductor element, each of the plural external electrodes having at its top surface a projecting stepped portion and a projected portion;

a fine wire electrically connected between a surface of at least one of the projecting stepped portions of the plural external electrodes and at least one of the plural electrodes of the semiconductor element; and an encapsulating resin which encapsulates the semiconductor element, the plural external electrodes, and the fine wire and whose external shape is a rectangular parallelepiped;

wherein both a bottom surface of the semiconductor element and a bottom surface of each of the plural external electrodes are exposed from a bottom surface of the encapsulating resin;

wherein a top surface of the semiconductor element and a top surface of each of the projecting stepped portions of the plural external electrodes are located substantially coplanar with each other; and wherein each of the projected portions of the plural external electrodes is exposed from a top surface of the encapsulating resin.

It is preferable that depressed portions are formed in bottom surface areas of the semiconductor device defined between external electrodes of the plural external electrodes and between the semiconductor element and an external electrode of the plural external electrode, wherein the depressed portions are recessed inside the encapsulating resin.

The present invention provides a method for the fabrication of a semiconductor device comprising the steps of:

(a) preparing a frame member;

the frame member including:

a plate-like frame major portion having a top surface and a bottom surface;

a plurality of electrode constituent portions which are projections formed on the top surface of the frame major portion, each of the plural electrode constituent portions having at its top surface a projecting stepped portion and a projected portion; and an element housing portion located in a top surface area of the frame major portion surrounded by the plural electrode constituent portions, the element housing portion housing therein a semiconductor element to be fixed thereto;

(b) fixing to the element housing portion of the frame member the semiconductor element having a plurality of electrodes;

(c) after the step (b), electrically connecting by a fine wire between at least one of the plural electrodes of the semiconductor element and a top surface of at least one of the projecting stepped portions of the plural electrode constituent portions;

(d) encapsulating, by a resin, a surface of the frame member on the side where the semiconductor element has been fixed to the element housing portion and has been electrically connected by the fine wire;

(e) after the step (d), grinding the frame major portion of the frame member such that the plural electrode constituent portions are separated from each other to become individual external electrodes, and exposing both a bottom surface of each of the plural external electrodes and a bottom surface of the semiconductor element from the resin; and (f) after the step (d), grinding a top surface of the resin on the side where the semiconductor element has been fixed to the element housing portion and has been electrically connected by the fine wire such that top surfaces of the projected portions are exposed from the resin top surface.

The present invention provides a semiconductor device comprising:

a semiconductor element having a plurality of electrodes;

a plurality of external electrodes disposed around the periphery of the semiconductor element, each of the plural external electrodes having at its top surface a projecting stepped portion and a projected portion and in its bottom surface a recessed portion;

a fine wire electrically connected between a surface of at least one of the projecting stepped portions of the plural external electrodes and at least one of the plural electrodes of the semiconductor element; and an encapsulating resin which encapsulates the semiconductor element, the plural external electrodes, and the fine wire and whose external shape is a rectangular parallelepiped;

wherein both a bottom surface of the semiconductor element and a bottom surface of each of the plural external electrodes are exposed from a bottom surface of the encapsulating resin;

wherein a top surface of the semiconductor element and a top surface of each of the projecting stepped portions of the plural external electrodes are located substantially coplanar with each other; and wherein each of the projected portions of the plural external electrodes is exposed from a top surface of the encapsulating resin.

It is preferable that depressed portions are formed in bottom surface areas of the semiconductor device defined between external electrodes of the plural external electrodes and between the semiconductor element and an external electrode of the plural external electrode, wherein the depressed portions are recessed inside the encapsulating resin.

The present invention provides a method for the fabrication of a semiconductor device comprising the steps of:

(a) preparing a frame member;

the frame member including:

a plate-like frame major portion having a top surface and a bottom surface;

a plurality of electrode constituent portions which are projections formed on the top surface of the frame major portion, each of the plural electrode constituent portions having at its top surface a projecting stepped portion and a projected portion and in its bottom surface a recessed portion; and an element housing portion located in a top surface area of the frame major portion surrounded by the plural electrode constituent portions, the element housing portion housing therein a semiconductor element to be fixed thereto;

(b) fixing the semiconductor element having a plurality of electrodes to the element housing portion of the frame member;

(c) after the step (b), electrically connecting by a fine wire between at least one of the plural electrodes of the semiconductor element and a top surface of at least one of the projecting stepped portions of the plural electrode constituent portions;

(d) encapsulating, by a resin, a surface of the frame member on the side where the semiconductor element has been fixed to the element housing portion and has been electrically connected by the fine wire such that at least a top surface of each of the projected portions of the plural electrode constituent portions projects; and (e) after the step (d), grinding the frame major portion of the frame member such that the plural electrode constituent portions are separated from each other to become individual external electrodes each having at its bottom surface the recessed portion, and exposing both a bottom surface of each of the plural external electrodes and a bottom surface of the semiconductor element from the resin.

It is preferable that (i) the frame member prepared in the step (a) includes a plurality of the element housing portions, (ii) the step (b) is a step of fixing a plurality of the semiconductor elements to the plural element housing portions, respectively, and (iii) the method further comprises after the step (e) a step of forming a stacked structure by fitting the recessed portion in the bottom surface of the external electrode into a projected portion of a different semiconductor device, wherein the projected portion is formed on an external electrode of the different semiconductor device so as to correspond to the recessed portion and, after the stacked structure formation step, a step of dividing the plural semiconductor elements in a stacked structure state into individual lamination type semiconductor devices, respectively.

BRIEF DESCRIPTION OF THE DRAWINGS

FIG. 1C is a bottom plan view of the semiconductor device of FIG. 1A, wherein FIG. 1A is a cross-sectional view taken on line IA-IA' of FIGS. 1B and 1C.

FIG. 6C is a bottom plan view of the semiconductor device of FIG. 6A, wherein FIG. 6A is a cross-sectional view taken on line VIA-VIA' of FIGS. 6B and 6C.

DESCRIPTION OF THE PREFERRED EMBODIMENTS

Figure 1A:
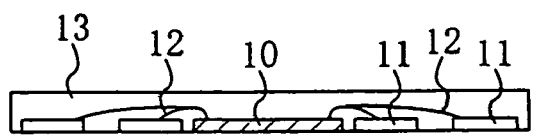
FIG. 1A is a cross section view schematically illustrating a cross-sectional structure for a semiconductor device according to a first embodiment of the present invention.

Hereinafter, embodiments of the present invention will be described with reference to the accompanying drawings. In the figures, for the purpose of keeping the description as simple as possible, components having substantially the same function have been assigned the same reference numeral. Note that the present invention will not be limited to the following embodiments.

Embodiment 1

Figure 1B:
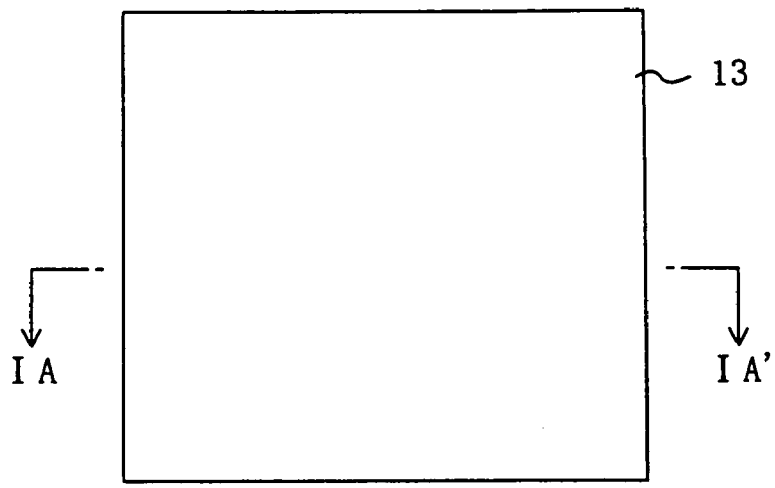
FIG. 1B is a top plan view of the semiconductor device of FIG. 1A.
Figure 1C:
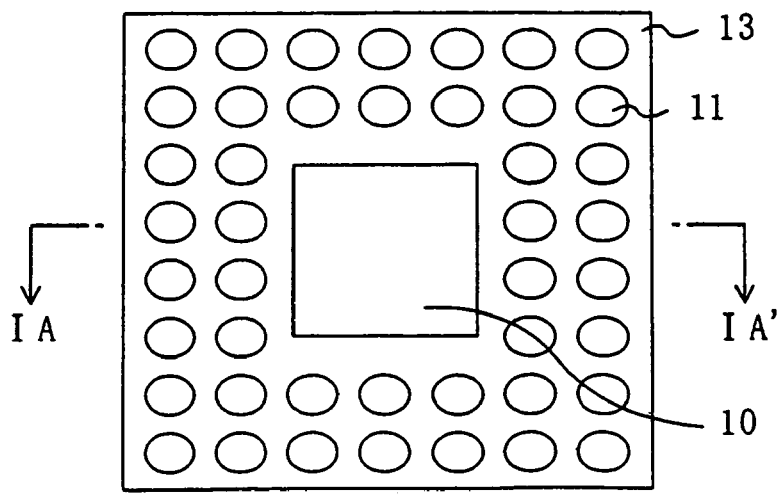

Referring to FIGS. 1A to 1C, a semiconductor device according to a first embodiment of the present invention will be described below. FIGS. 1A-1C schematically illustrate configurations of the present semiconductor device as viewed in cross section, in top plan, and in bottom plan, respectively.

The semiconductor device of the present embodiment includes a semiconductor element (for example, a semiconductor chip) 10, a plurality of external electrodes 11 disposed around the periphery of the semiconductor element 10, a fine wire 12 for establishing electrical connection between an external electrode 11 and an electrode (not shown) of the semiconductor element 10, and an encapsulating resin 13 for encapsulating the semiconductor element 10, the external electrodes 11, and the fine wires 12. The external shape of the encapsulating resin 13 is a rectangular parallelepiped. The bottom surface of the semiconductor element 10 and the bottom surface of each external electrode 11 are exposed from the bottom surface of the encapsulating resin 13. Further, the top surface of the semiconductor element 10 and the top surface of each external electrode 11 are located substantially coplanar with each other.

In the semiconductor device of the present embodiment, it is arranged such that the bottom surface of the semiconductor element 10 and the bottom surface of the external electrode 11 are each exposed from the bottom surface of the encapsulating resin 13, and the top surface of the semiconductor element 10 and the top surface of the external electrode 11 are located substantially coplanar with each other. Such arrangement makes it possible to provide an extremely thin configuration for the semiconductor device. Moreover, the external electrodes 11 are surface-disposed in two dimensions, thereby making the semiconductor device configuration of the present embodiment fully capable of coping with multipin-ization.

The configuration of the semiconductor device of the present embodiment will be further described. The semiconductor device of the present embodiment does not employ a lead frame in a conventional semiconductor device as described above. The semiconductor device of the present embodiment includes the semiconductor element 10, the external electrodes 11, the fine wires 12, and the encapsulating resin 13 for encapsulation of these components. In other words, components for a conventional lead frame, such as a frame portion, a die pad portion, a lead portion, an inner lead portion, an outer lead portion, and a tie bar portion, are not employed at all in the semiconductor device of the present embodiment. As illustrated, the semiconductor device of the present embodiment has a rectangular outline and is extremely thin. The surfaces (bottom surfaces) of the external electrodes 11 are exposed at the bottom surface of the semiconductor device, being arranged in a grid pattern. The bottom surface of the semiconductor element 10 is also exposed at the bottom surface of the semiconductor device. Since the bottom surface of the semiconductor element 10 is exposed, this provides the advantage of excellent heat radiation.

More specifically, the semiconductor device of the present embodiment includes the semiconductor chip 10 which is extremely thin (50 μm), the external electrodes 11 disposed around the periphery of the semiconductor chip 10, the metal fine wire 12 for establishing electrical connection between the surface of the external electrode 11 and the electrode pad (not shown) on the surface of the semiconductor element 10, and the encapsulating resin 13 of insulative resin which encapsulates the outer peripheries of the semiconductor element 10, the external electrodes 11, and the metal fine wires 12, forming its external shape into a rectangular parallelepiped. The back of the semiconductor element 10 and one of the surfaces of the external electrode 11 to which the metal fine wire 12 is not connected are exposed at the bottom surface of the encapsulating resin 13 formed into a rectangular parallelepiped. The external electrodes 11 are arranged, in double or more arrangement and in parallel with each other, around the outer periphery of the semiconductor element 10. In the present embodiment, the external electrodes 11 are disposed, in two surround rows, around the semiconductor element 10.

Further, in the semiconductor device of the present embodiment, the top surface of the semiconductor element 10 and the top surface of the external electrode 11 are located substantially coplanar with each other. In other words, the top surface level of the semiconductor element 10 and the top surface level of the external electrode 11 are substantially the same. Note that the top surface of the semiconductor element 10 and that of the external electrode 11 are not necessarily at the same level in the strict sense of the word. For example, when there is some trouble for interconnection by the metal fine wire 12, the top surface level of the external electrode 11 may lie below that of the semiconductor element 10.

The semiconductor device of the present embodiment is an extremely thin, resin-encapsulated semiconductor device whose total thickness is 100 μm. The semiconductor element 10 is formed and processed to a thickness of 50 μm. The external electrodes 11 disposed around the periphery of the semiconductor element 10 are also processed to the same thickness as the semiconductor element 10 (i.e., 50 μm). Further, the distance between the top of the metal fine wire 12 connected to the top surface of the semiconductor element 10 for electrical connection therewith and the top surface of the semiconductor element 10 is also set at less than 50 μm. Accordingly, the thickness of the encapsulating resin 13 located over the top surface region of the semiconductor element 10 is 50 μm for covering the metal fine wire 12, and the resin-encapsulated semiconductor device of the present embodiment is realized having a total thickness of 100 μm.

When the connection limitation of the metal fine wire 12 is relaxed by increasing the thickness of the encapsulating resin 13 on the semiconductor element 10 to above 50 μm (for example, 100 μm), or when the thickness of the semiconductor element 10 is set to above 50 μm (for example, 100 μm), the total thickness becomes 150 μm or 200 μm. Such arrangement may be made. However, the present embodiment makes it possible to realize a semiconductor device whose total thickness is not more than 150 μm.

Figure 2A:
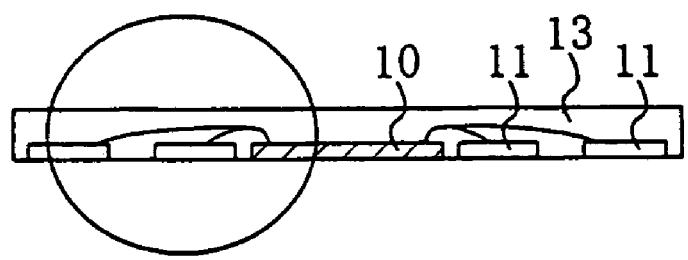
FIG. 2A is a cross-sectional view of the semiconductor device according to the first embodiment and FIG. 2B is an enlarged view of a particular portion of the semiconductor device according to the first embodiment.
Figure 2B:
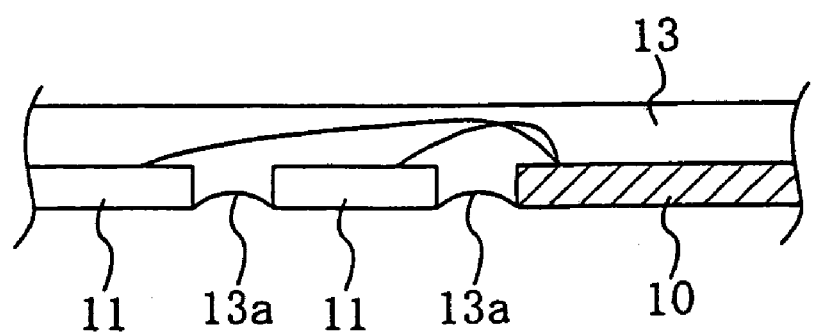

Reference is now made to FIGS. 2A and 2B. FIG. 2A is a cross-sectional view of the semiconductor device of the present embodiment. FIG. 2B is an enlarged cross-sectional view of a circled region in FIG. 2A. In the present embodiment, depressed portions 13a are formed in bottom surface areas of the semiconductor device defined between the external electrodes 11 and between the semiconductor element 10 and the external electrode 11, each of the depressed portions 13a being recessed inside the encapsulating resin 13. In other words, the depressed portions 13a having a curvature on the inside of the thickness direction in cross section (in the figure, the upper side direction) are formed in surface areas of the encapsulating resin 13 defined between the external electrodes 11 and between the semiconductor element 10 and the external electrode 11. Alternatively, the depressed portions 13a may be formed in surface areas of the encapsulating resin 13 located on the outer edge.

The provision of the depressed portions 13a in the bottom surface of the semiconductor device makes it possible to allow both the semiconductor element 10 and the external electrodes 11 to project from the encapsulating resin's 13 surface, thereby securing a stand-off during substrate mounting. As a result, it is possible to make the structure suitable for mounting. That is to say, it is arranged such that the bottom surface of the external electrodes 11 is not flush with that of the encapsulating resin 13. Since the encapsulating resin 13 is made concave, this makes it possible to improve the reliability of electrical contact between the bottom surface of each external electrode 11 and a substrate such as a printed circuit board on which the semiconductor device is mounted. Moreover, by virtue of the existence of the depressed portions 13a (particularly one located between the external electrodes 11), application of thermal stress to the external electrodes 11 can be reduced, thereby providing an effective structure for extremely thin semiconductor devices such as the semiconductor device of the present embodiment whose thickness is as thin as that of the chip.

Next, a method for the fabrication of the semiconductor device of the present embodiment will be described with reference to FIG. 3, FIG. 4, and FIGS. 5A-5H.

Figure 3:
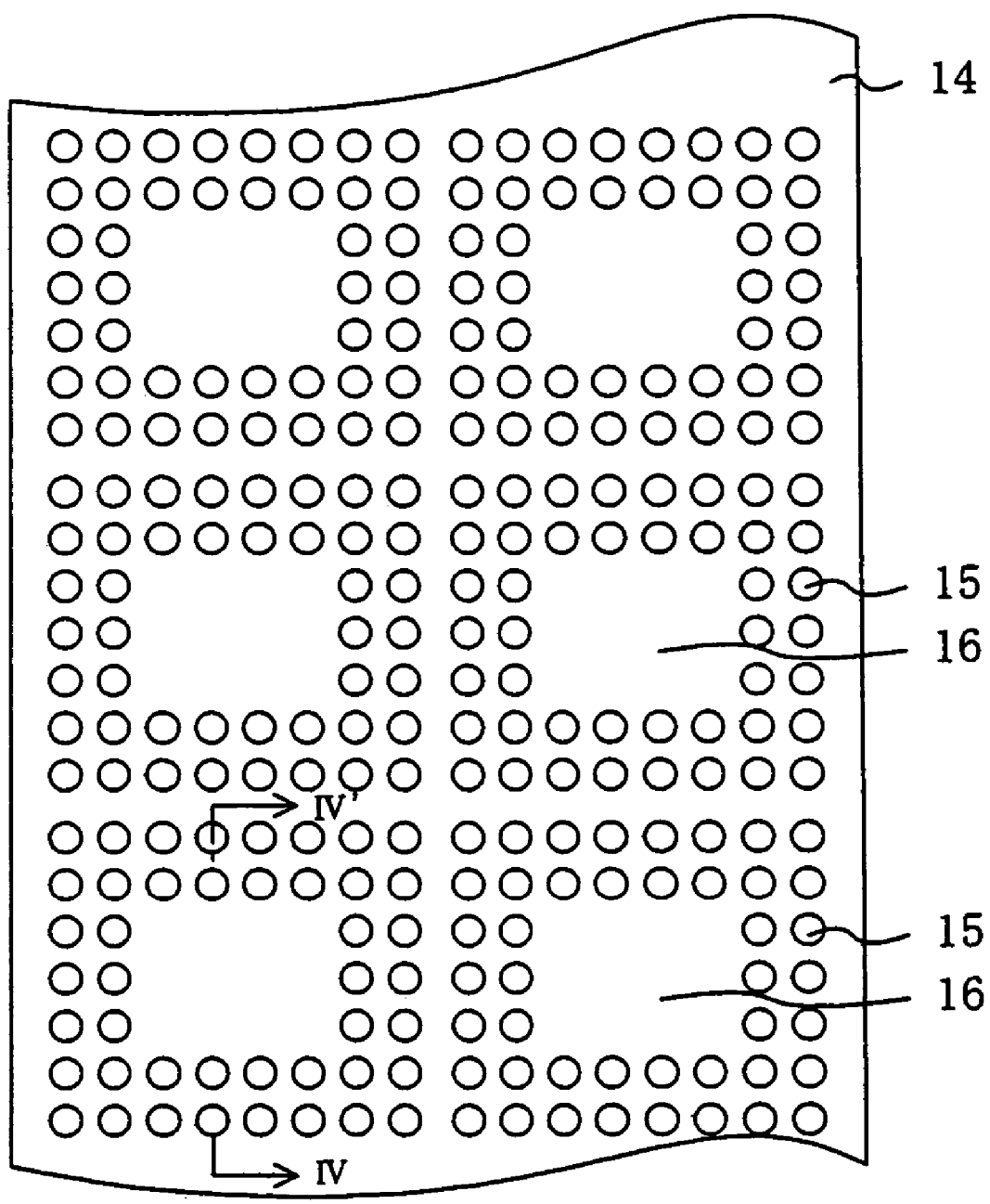
FIG. 3 is a top plan view (a plan view) showing a frame member which is used in a method for the fabrication of the semiconductor device according to the first embodiment.
Figure 4:
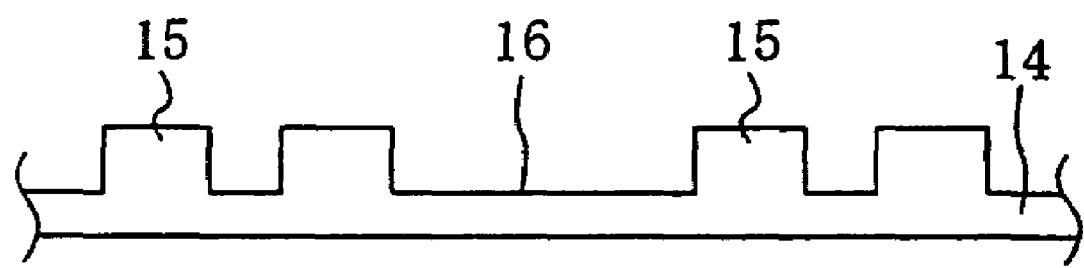
FIG. 4 is a cross-sectional view of the frame member of FIG. 3.

First of all, a frame member that is used in the semiconductor device fabrication method of the present embodiment will be described. FIG. 3 shows a plan view of the frame member. FIG. 4 is a cross-sectional view illustrating a cross section taken on line VI-VI' of FIG. 3.

The frame member includes a frame major portion 14 formed of a metal plate of copper, iron, et cetera (or a conductive plate), a plurality of electrode constituent portions 15 which are projections disposed on the metal plate within the frame major portion's 14 surface, and an element housing portion 16 which is so provided as to be surrounded by the electrode constituent portions 15 and which houses a semiconductor element (10). These plural electrode constituent portions 15, which will finally become the individual external electrodes 11, are arranged correspondingly to the electrode pitch of the semiconductor element. The element housing portion 16 is a recessed portion defined by the projecting of the electrode constituent portions 15. A recessed portion defined between each electrode constituent portion 15 is a separation region when the electrode constituent portions 15 constitute the respective external electrodes 11, respectively.

Further, the amount that each electrode constituent portion 15 projects is substantially the same as the thickness of the semiconductor element (10) that is housed in the element housing portion 16. If the thickness of the semiconductor element is 250 μm, then the projection amount of the electrode constituent portion 15 is approximately 250 μm. Alternatively, the thickness of an element mounting adhesive which is slightly thick is taken into consideration, and the projection amount, inclusive of the adhesive thickness, may be determined such that the top surface level of the electrode constituent portion 15 and that of the semiconductor element housed in the element housing portion 16 are substantially the same. By adequately setting the projection amount of the electrode constituent portions 15, it is possible to set the top surface of the electrode constituent portions 15 to lie below or above that of the semiconductor element housed in the element housing portion 16.

In the present embodiment, the electrode constituent portions 15 are double disposed with respect to the element housing portion 16. However, the manner of disposing the electrode constituent portions 15 and the number of the electrode constituent portions 15 can be set according to the number of electrodes of the semiconductor element to be housed in the element housing portion 16. Further, the projecting electrode constituent portions 15 are formed by etching or pressing a metal plate.

The semiconductor device of the present embodiment is fabricated in the following way by the use of the above-described frame member.

Figure 5A:
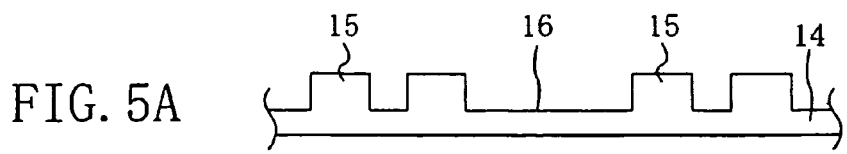
FIGS. 5A to 5H are cross-sectional views describing steps of the semiconductor device fabrication method according to the first embodiment.

First of all, as shown in FIG. 5A, the frame member is prepared which includes the frame major portion 14 of a metal plate, the plural electrode constituent portions 15 which are projections formed on the metal plate within the frame major portion's 14 surface and which are disposed correspondingly to the electrode pitch of the semiconductor element 10, and the element housing portion 16 which is so defined to be surrounded by the electrode constituent portions 15.

Figure 5B:
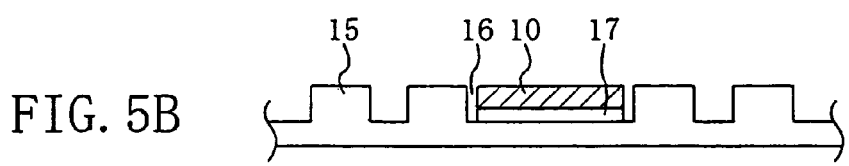

Next, as shown in FIG. 5B, the semiconductor element 10 is adhesive fixed to the element housing portion 16 of the frame member with an adhesive 17. In this state, the top surface level of the semiconductor element 10 and the top surface level of each electrode constituent portion 15 are the same. The adhesive 17 used here may be either a conductive adhesive or an insulative adhesive. Any type of adhesive may be used as long as the semiconductor element 10 can be fixedly affixed to the element housing portion 16. Preferably, the adhesive 17 is an adhesive whose coefficient of thermal expansion is near that of the semiconductor element 10 and that of the frame member. Note that in the figure the thickness of the adhesive 17 is exaggeratedly shown for the sake of the description.

Figure 5C:
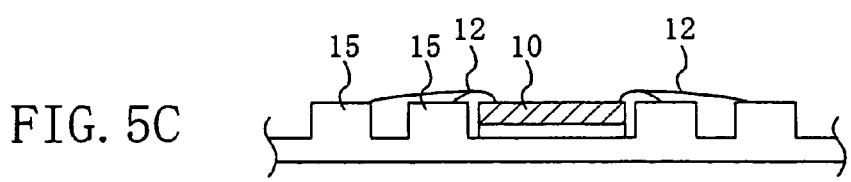

Next, as shown in FIG. 5C, an electrode (not shown) on the surface of the semiconductor element 10 and the top surface of each of the electrode constituent portions 15 of the frame member are electrically connected together by the metal fine wire 12. In this connection by the metal fine wire 12, the loop height is made as low as possible. As the metal fine wire 12, metal fine wires used in wire bonding, such as gold (Au) wires and aluminum (Al) wires, may be used. Alternatively, other than these metal fine wires, conductive wires of resin may be used. Moreover, metal fine wires whose surface is coated with insulative material so that even when the metal fine wires 12 come into contact with each other there is produced no effect, may be used. Particularly, in the case of using metal fine wires coated with insulative material, it is possible to provide low-height loop connection, because undesirable effects, due to electrical short by contact of the metal fine wires 12 and due to contact with an end portion of the electrode constituent portion 15 or with an end portion of the semiconductor element 10, can be eliminated.

Figure 5D:
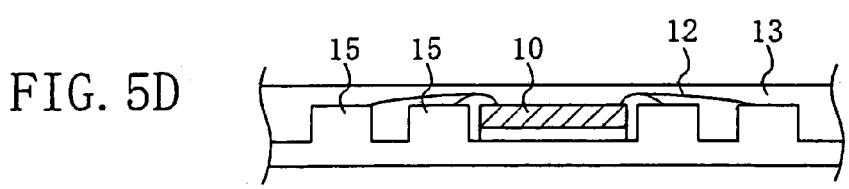

Next, as shown in FIG. 5D, the top surface side of the frame member, on which the semiconductor element 10 has been mounted and wire interconnections have been established by the metal fine wires 12, is encapsulated by the encapsulating resin 13. In this single-side encapsulation, the head top portion of the low-loop connected metal fine wire 12 is covered with the encapsulating resin 13 and the top surface of the semiconductor element 10 is encapsulated for a thickness of 50 µm. As the encapsulating resin 13, a resin with insulative properties is used. In the present embodiment, the encapsulating resin 13 is a thermosetting resin such as an epoxy resin. As the material to form the encapsulating resin 13, a non-permeable resin or a permeable resin may be used. The use of a permeable resin as a material to form the encapsulating resin 13 provides some advantages. One is that it is possible to confirm a post-encapsulation inside state, and if the permeable resin is a photo-curing resin, this also provides the advantage that it is possible to allow the resin to harden by ultraviolet radiation.

Figure 5E:
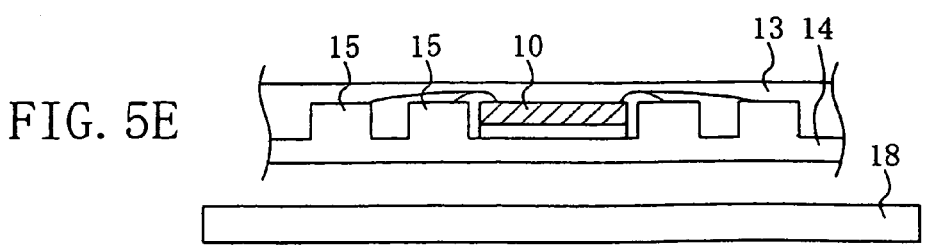

Next, as shown in FIG. 5E, the frame member, which has undergone resin encapsulation, is subjected to grinding. More specifically, the frame major portion 14 located on the bottom surface of the frame member is subjected to grinding by a grinding member 18 such as a grinder. In this grinding step, the thickness of the entire frame member is made thin by grinding from the side of the bottom surface of the frame member. The frame member is ground to such an extent that the frame major portion 14 at the bottom surface is removed, the electrode constituent portions 15 are separated from each other, the bottom surface of the semiconductor element 10 is exposed, and the encapsulating resin 13 is exposed between electrode constituent portions 15 and between the semiconductor element 10 and an electrode constituent portion 15. In the present embodiment, the semiconductor element 10 is ground to a thickness of 50 µm.

It is preferable that the grinding member 18 be an elastic grinding member. In the case the grinding member 18 is an elastic grinding member, when subjecting the frame member to grinding for removal of the frame major portion 14 at the bottom surface, the encapsulating resin 13 is ground more than the components formed of metal material because of the difference in grinding rate between the electrode constituent portion 15 and the encapsulating resin 13 and between the semiconductor element 10 and the encapsulating resin 13. This produces the state in which a surface area of the encapsulating resin 13 defined between the electrode constituent portions 15, a surface area of the encapsulating resin 13 defined between the semiconductor element 10 and the electrode constituent portion 15, and an outside surface area of the encapsulating resin 13 are recessed inside the encapsulating resin 13 for several micrometers to form depressed portions, i.e., depressed portions having their curvature on the inside of the thickness direction in cross section. Particularly, because of the fact that the grinding member 18 has elastic properties, the difference in grinding amount caused by the difference in grinding rate between the metal and resin materials is accelerated when pressed. As a result, the depressed portions are formed in a more conspicuous manner. By virtue of the provision of such depressed portions in the bottom surface of the encapsulating resin 13, the semiconductor device fabricated has such a structure that the semiconductor element and each of the external electrodes project outside the encapsulating resin's 13 surface, thereby providing a stand-off during substrate mounting. This structure is suitable for substrate mounting. Other than mechanical grinding by the use of the grinding member 18, chemical etching may be useful or a technique using laser to form depressed portions in the bottom surface may be employed. However, the grinding member 18 having elastic properties is much easy to employ and provides advantages over these techniques.

Figure 5F:
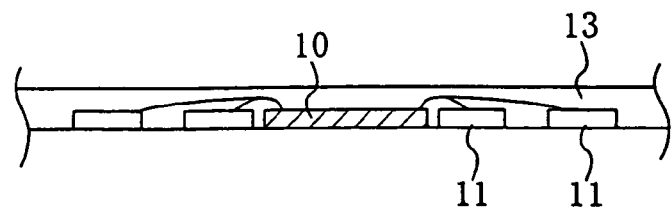

When the bottom surface of the frame member is ground to such an extent that the frame major portion 14 is removed away, this provides a structure in which the bottom surface of the semiconductor element 10 is ground to be exposed from the encapsulating resin 13 and the electrode constituent portions 15 are separated from each other to become the individual external electrodes 11, respectively (see FIG. 5F). Since, as described above, the electrode constituent portions 15 are formed by etching or pressing a metal plate, the external electrodes 11 made of metal (conductive material) can be formed by separation of the electrode constituent portions 15. Further, the frame major portion 14 is removed at this stage. Therefore, the frame major portion 14 is not necessarily made of metal (conductive material). Accordingly, as long as the electrode constituent portions 15 are formed of a material allowing the electrode constituent portions 15 to function as an electrode, the frame major portion 14 and the electrode constituent portions 15 can be made of different materials. However, in view of the costs and the fabrication process, preparing the frame major portion 14 and the electrode constituent portions 15 by etching processing or press processing of a metal plate and by removing the frame major portion 14 to form the external electrodes 11 from the electrode constituent portions 14, provides greater advantages.

Figure 5G:
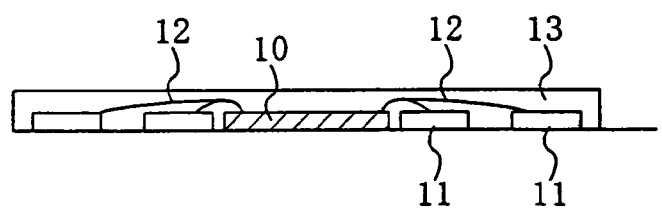

Next, as shown in FIG. 5G, division into package units for the individual semiconductor elements 10 is performed as shown in FIG. 5G, to provide extremely thin semiconductor devices of the present embodiment having a rectangular parallelepiped external shape. In a conventional semiconductor device fabrication method, a lead frame made of metal is cut; however, in accordance with the fabrication method of the present embodiment the encapsulating resin 13 is cut, thereby relatively facilitating division into package units for the individual semiconductor elements 10. Further, over a technique of performing resin encapsulation for every single semiconductor element, the fabrication method of the present embodiment has the great advantage that a great number of semiconductor devices can be fabricated by carrying out a single resin encapsulation step.

The semiconductor device of the present embodiment (FIG. 5G) is an extremely thin semiconductor device of the resin encapsulation type whose total thickness is 100 μm, and when compared with a currently-used semiconductor element having a thickness of 250 μm (a chip thickness), the present embodiment provides a semiconductor device that is package configured at a thickness thinner than the thickness of the currently-used semiconductor element. More specifically, the present embodiment is able to provide a semiconductor device including the semiconductor element 10 having an extremely thin thickness of 50 μm, the external electrodes 11 disposed in a grid pattern around the periphery of the semiconductor element 10, the metal fine wire 12 for providing electrical connection between the surface of the external electrode 11 and the electrode on the surface of the semiconductor element 10, and the encapsulating resin 13 having insulative properties which encapsulates the outer peripheries of the semiconductor element 10, the external electrodes 11, and the metal fine wires 12, forming its external shape into a rectangular parallelepiped. As described above, both the back of the semiconductor element 10 and the surfaces of the external electrodes 11 to which the metal fine wires 12 are not connected are exposed at the bottom surface of the encapsulating resin 13 shaped into a rectangular parallelepiped, and the top surface level of the semiconductor element 10 and the top surface level of the external electrode 11 are substantially the same.

Figure 5H:
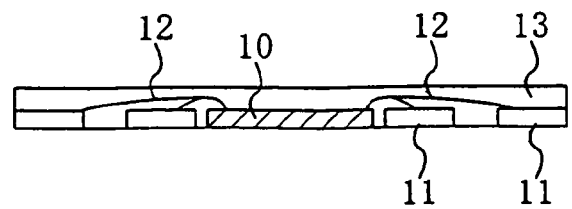

When performing division into the individual semiconductor devices from the state shown of FIG. 5F, if cutting is made at a position (a division position) including an end portion of the external electrode 11, this makes it possible to provide a semiconductor device structure in which the end portion of the external electrode 11 is exposed also from the lateral surface of the encapsulating resin 13 (FIG. 5H). In the semiconductor device structure shown in FIG. 5H, the external electrode 11 is exposed from the lateral surface of the encapsulating resin 13, thereby providing enhanced strength during substrate mounting and improving mounting reliability.

Further, in the present embodiment, it is possible to conduct characteristic testing at the construction state of FIG. 5F. In other words, it is possible to conduct characteristic testing at the state in which the frame major portion at the bottom surface of the frame member has been removed by grinding, the bottom surface of the semiconductor element 10 has been so ground as to be exposed from the encapsulating resin 13, and the electrode constituent portions 15 have been separated to constitute the individual external electrodes 11, respectively. This configuration state is the state in which a plurality of semiconductor elements are contained, thereby making it possible to improve testing efficiency. After the testing, as shown in FIG. 5G, division is made for the individual semiconductor elements 10 and already-tested, extremely thin semiconductor devices can be obtained.

Embodiment 2

Figure 6A:
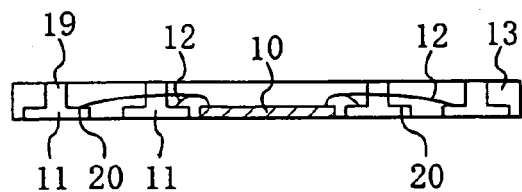
FIG. 6A is a cross section view schematically illustrating a cross-sectional structure for a semiconductor device according to a second embodiment of the present invention.
Figure 6B:
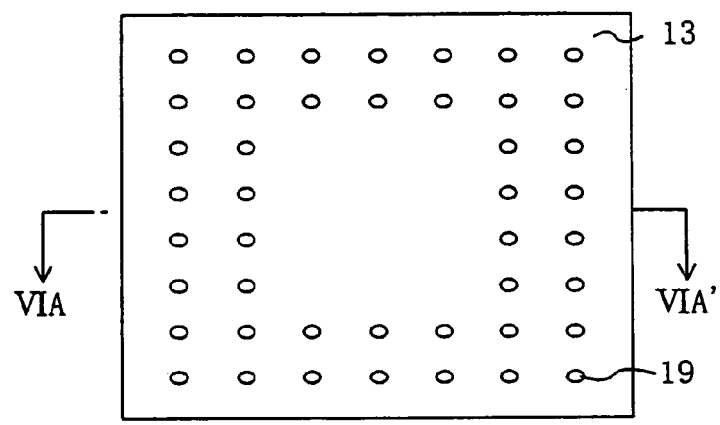
FIG. 6B is a top plan view of the semiconductor device of FIG. 6A.
Figure 6C:
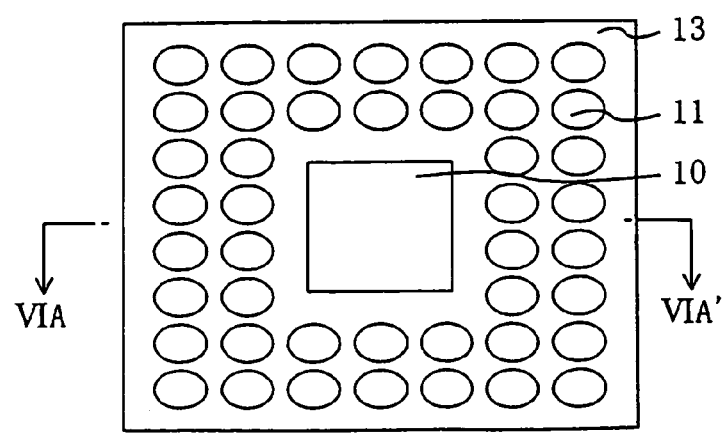

A semiconductor device and its fabrication method according to a second embodiment of the present invention will be described below. FIGS. 6A-6C schematically illustrate configurations of the present semiconductor device as viewed in cross section, in top plan, and in bottom plan, respectively. The cross-sectional view of FIG. 6A is a cross section taken on line VIA-VIA' of FIGS. 6B and 6C.

The semiconductor device of the present embodiment differs from the semiconductor device of the first embodiment in comprising a variation of the external electrode 11 that has a projecting stepped portion 20 at the top and a projected portion 19. Another difference is that the projected portion 19 of the external electrode 11 is exposed from the top surface of the encapsulating resin 13 in the second embodiment. In order to briefly describe the second embodiment, the description will be made focusing mainly on differences between the first embodiment and the present embodiment and the same points as the first embodiment will be omitted or described in a simplified manner.

The semiconductor device of the present embodiment, shown in FIGS. 6A-6C, has a rectangular external shape and is extremely thin. The bottom surfaces of the external electrodes 11 are exposed at the bottom surface of the semiconductor device, being arranged in a grid pattern, while the top surfaces of the external electrodes 11 are exposed at the top surface of the semiconductor device, being arranged in a grid pattern, and the bottom surface of the semiconductor element 10 is exposed. In accordance with the semiconductor device of the present embodiment, the top surface of each external electrode 11 is exposed also at the top surface of the semiconductor device, so that in addition to the effects obtained in the first embodiment another effect of enabling both of the top and bottom surfaces of the semiconductor device to act as an external electrode surface can be obtained.

Hereinafter, the semiconductor device of the present embodiment will be explained more concretely. The semiconductor device of the present embodiment includes the semiconductor element 10 having an extremely thin thickness of 50 μm, the external electrodes 11 disposed around the periphery of the semiconductor element 10 and each having the projected portion 19, the metal fine wire 12 for providing electrical connection between the projecting stepped portion's 20 surface and an electrode pad (not shown) on the surface of the semiconductor element 10, and the encapsulating resin 13 having insulative properties which encapsulates the outer peripheries of the semiconductor element 10, the external electrodes 11, and the metal fine wires 12, forming its external shape into a rectangular parallelepiped. Both the back of the semiconductor element 10 and the surface of the external electrode 11 to which the metal fine wire 12 is not connected are exposed from the bottom surface of the encapsulating resin 13 whose external shape is formed into a rectangular parallelepiped. The top surface of the projected portion 19 of the external electrode 11 is exposed from the top surface of the encapsulating resin 13. The top surface of the semiconductor element 10 and the top surface of the projecting stepped portion 20 of the external electrode 11 are located substantially coplanar with each other. In other words, the top surface level of the semiconductor element 10 and the top surface level of the projecting stepped portion 20 of the external electrode 11 are substantially the same.

The semiconductor device of the present embodiment is a resin-encapsulated semiconductor device having an extremely thin total thickness of 100 µm, in which the semiconductor element 10 is formed and processed to have a thickness of 50 µm. The thickness from the bottom surface of the external electrode 11 located around the periphery of the semiconductor element 10 to the top surface of the projecting stepped portion 20 is processed to the same thickness as that of the semiconductor element 10, i.e., 50 µm. Further, the distance between the top of the metal fine wire 12 connected to the top surface of the semiconductor element 10 for establishing electrical connection and the surface of the semiconductor element 10 is set below 50 µm. Accordingly, the encapsulating resin 13 located over the top surface region of the semiconductor element 10 has a thickness of 50 µm enough to cover the metal fine wires 12, and the amount that the projected portion 19 of the external electrode 11 projects is set equal to the thickness of the encapsulating resin 13 on the top surface region of the semiconductor element 10. The semiconductor device with a total thickness of 100 µm is thus realized.

Further, like the configuration of the semiconductor device of the first embodiment, also in the semiconductor device of the present embodiment, the depressed portions are formed in a surface area of the encapsulating resin 13 defined between each external electrode 11, in a surface area of the encapsulating resin 13 defined between the semiconductor element 10 and the external electrode 11, and in an outside surface area of the encapsulating resin 13.

Next, a method for the fabrication of the semiconductor device of the present embodiment will be described with reference to FIG. 7, FIG. 8, and FIGS. 9A-9H.

Figure 7:
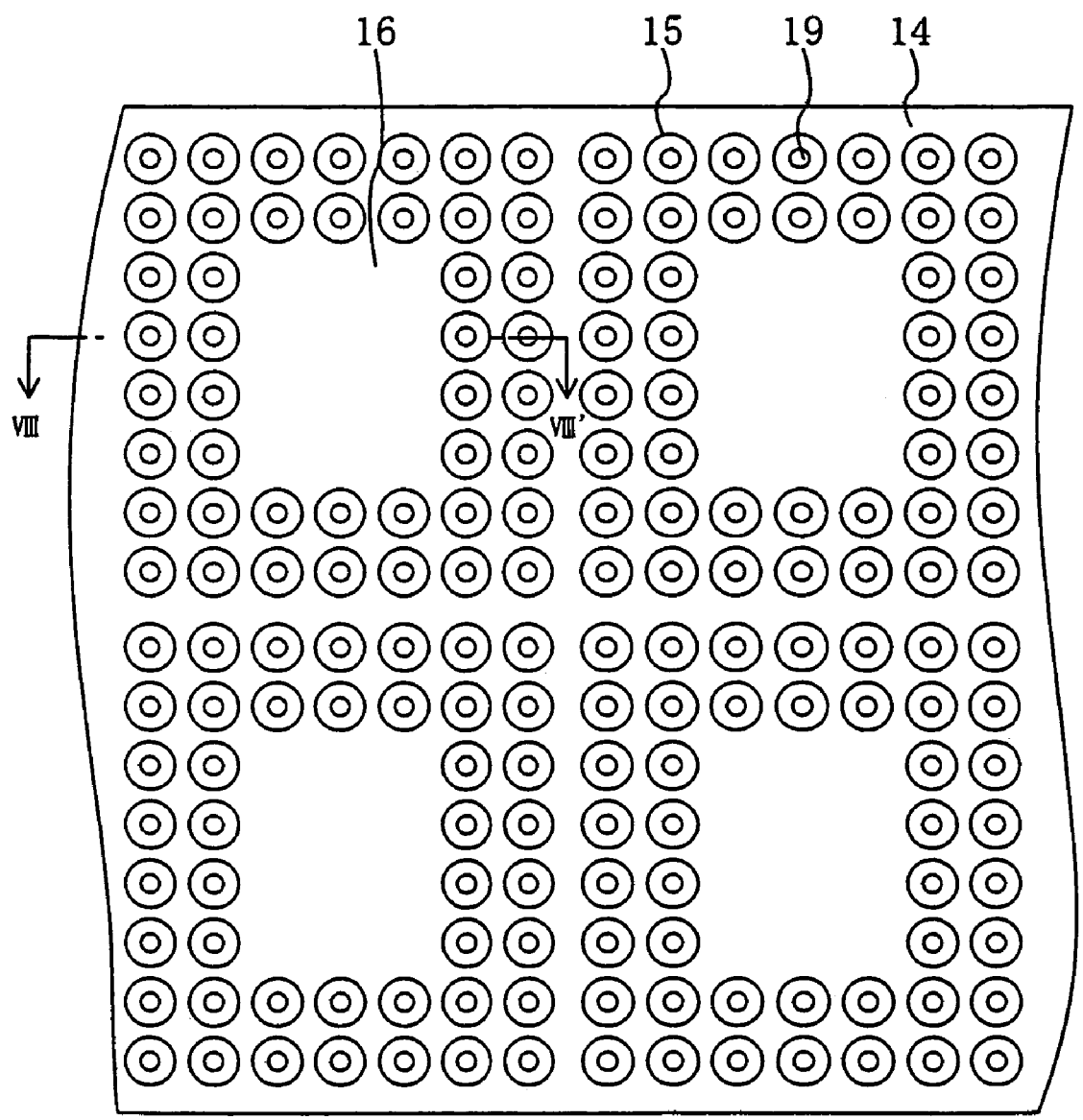
FIG. 7 is a top plan view (a plan view) showing a frame member which is used in a method for the fabrication of the semiconductor device according to the second embodiment.
Figure 8:
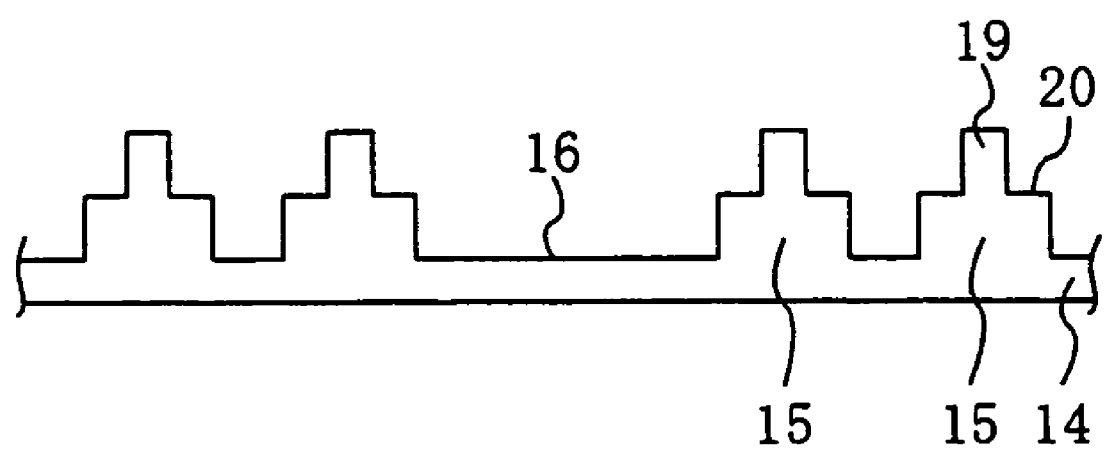
FIG. 8 is a cross-sectional view of the frame member of FIG. 7.

First of all, the frame member that is used in the fabrication method of the present embodiment will be explained. FIG. 7 shows a plan view of the frame member. FIG. 8 is a cross-sectional view illustrating a cross section taken on line VIII-VIII' in FIG. 7.

As diagramed in the figures, the frame member that is used in the present embodiment includes the frame major portion 14 formed of a metal plate of copper, iron, et cetera, the electrode constituent portions 15 which are projections disposed on the metal plate within the frame major portion's 14 surface, which are arrayed correspondingly to the electrode pitch of a semiconductor element that is placed, and which each have the projecting stepped portion 20 at the top and the projected portion 19, and the element housing portion 16 which is so provided as to be surrounded by the electrode constituent portions 15. As in the first embodiment, the element housing portion 16 is a recessed portion defined by the projecting of the electrode constituent portions 15. Recessed portions defined between each electrode constituent portion 15 form separation regions when the electrode constituent portions 15 constitute the individual external electrodes 11, respectively.

Further, the amount of projection of the electrode constituent portion 15 up to the top surface of the projecting stepped portion 20 is substantially the same as the thickness of the semiconductor element that is housed in the element housing portion 16. If the thickness of the semiconductor element is 250 µm, then the projection amount to the projecting stepped portion's 20 top surface is about 250 µm. Alternatively, the thickness of an element mounting adhesive which is slightly thick is taken into consideration and the projection amount, inclusive of the adhesive thickness, may be determined such that the top surface level of the projecting stepped portion 20 of the electrode constituent portion 15 and that of the semiconductor element housed in the element housing portion 16 are substantially the same. In the present embodiment, in order to expose the projected portion 19 from the top surface, the projection amount of the projected portion 19 is set not less than 50 µm.

In the present embodiment, the electrode constituent portions 15 are arranged in double disposition relative to the element housing portion 16. However, the manner of disposing the electrode constituent portions 15 and the number of the electrode constituent portions 15 can be set according to the number of electrodes of the semiconductor element that is housed in the element housing portion 16. Further, the projecting electrode constituent portions 15 are formed by etching or pressing a metal plate.

The semiconductor device of the present embodiment is fabricated in the following way by the use of the above-described frame member.

Figure 9A:
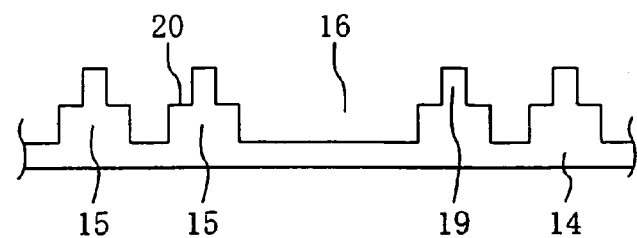
FIGS. 9A to 9H are cross-sectional views describing steps of the semiconductor device fabrication method according to the second embodiment.

First of all, as shown in FIG. 9A, the frame member is prepared which includes the frame major portion 14 of a metal plate, the plural electrode constituent portions 15 which are projections formed on the metal plate within the frame major portion's 14 surface, which are arranged correspondingly to the electrode pitch of the semiconductor element 10, and which each have the projecting stepped portion 20 at the top and the projected portion 19, and the element housing portion 16 which is so provided to be surrounded by the electrode constituent portions 15.

Figure 9B:
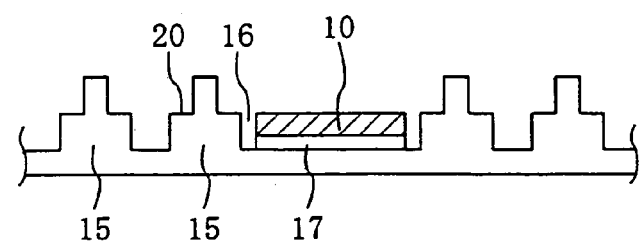

Next, as shown in FIG. 9B, the semiconductor element 10 is adhesive fixed to the element housing portion 16 with the adhesive 17, in which state the top surface level of the semiconductor element 10 and the top surface level of the projecting stepped portion 20 of the electrode constituent portion 15 are substantially the same. Moreover, the adhesive 17 used here is either a conductive adhesive or an insulative adhesive. Any type of adhesive can be used as long as the semiconductor element 10 is fixedly affixed to the element housing portion 16. Preferably, the adhesive 17 is an adhesive whose coefficient of thermal expansion is near that of the semiconductor element 10 and that of the frame member.

Figure 9C:
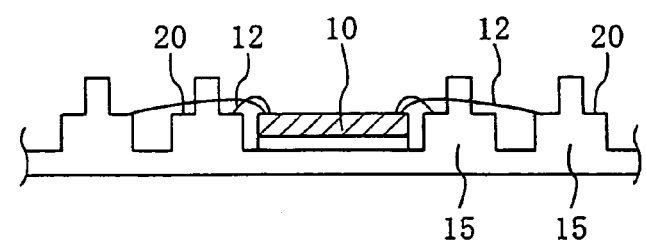

Next, as shown in FIG. 9C, an electrode (not shown) on the surface of the semiconductor element 10 and the top surface of the projecting stepped portion 20 of each electrode constituent portion 15 of the frame member are electrically connected together by the metal fine wire 12. In this connection by the metal fine wire 12, the loop height is made as low as possible. As in the first embodiment, as the metal fine wire 12, a gold (Au) wire or an aluminum (Al) wire usually used in wire bonding can be used. However, other than these wires, metal fine wires, whose surface is coated with insulative material so that even when the metal fine wires 12 come into contact with each other there is produced no effect, may be used. Particularly, in the case of using metal fine wires coated with insulative material, it is possible to provide low-height loop connection, because undesirable effects, due to electrical short by contact of the metal fine wires 12 and due to contact with an end portion of the electrode constituent portion 15 or with an end portion the semiconductor element 10, can be eliminated.

Figure 9D:
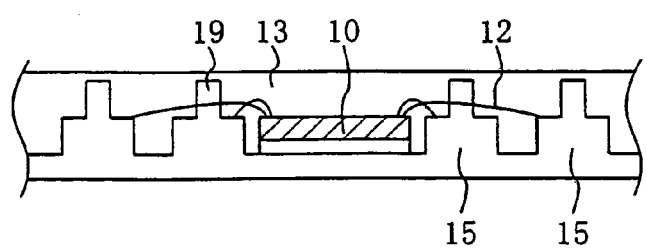

Next, as shown in FIG. 9D, the top surface side of the frame member, on which the semiconductor element 10 has been placed and wire interconnection has been established by the metal fine wire 12, is encapsulated by the encapsulating resin 13. In this single-side encapsulation, the head top portion of the low-loop connected metal fine wire 12 is covered with the encapsulating resin 13, the top surface of the semiconductor element 10 is encapsulated for a thickness of 50 μm, and either the projected portion 19 of the electrode constituent portion 15 is covered with the encapsulating resin 13 or the encapsulating resin 13 is at the same level as the top surface of the projected portion 12. As the encapsulating resin 13, a resin having insulative properties (for example, a thermosetting resin such as an epoxy resin) is used and a non-permeable resin or a permeable resin may be used. The use of a permeable resin as a material to form the encapsulating resin 13 provides some advantages. One is that it is possible to confirm a post-encapsulation inside state, and if the permeable resin is a photo-curing resin, this also provides the advantage that it is possible to allow the resin to harden by ultraviolet radiation.

Figure 9E:
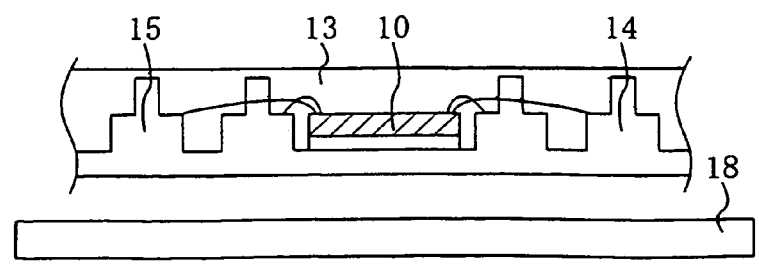
Figure 9F:
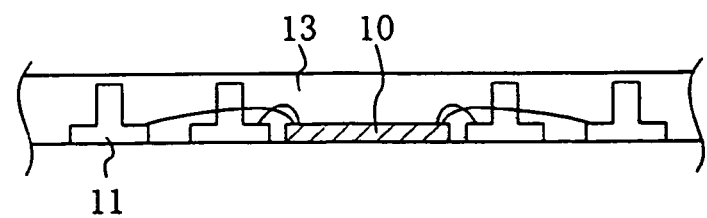

Next, as shown in FIG. 9E, the frame member, which has undergone resin encapsulation, is subjected to grinding. More specifically, the frame major portion 14 located on the bottom surface of the frame member is subjected to grinding by a grinding member 18 such as a grinder. In this grinding step, the thickness of the entire frame member is made thin by grinding from the side of the bottom surface of the frame member. The frame member is ground to such an extent that the frame major portion 14 at the bottom surface is removed, the electrode constituent portions 15 are separated from each other, the bottom surface of the semiconductor element 10 is exposed, and the encapsulating resin 13 is exposed between electrode constituent portions 15 and between the semiconductor element 10 and an electrode constituent portion 15. In the present embodiment, the semiconductor element 10 is ground to a thickness of 50 μm.

As in the first embodiment, it is preferable that the grinding member 18 be an elastic grinding member. In the case the grinding member 18 is an elastic grinding member, when subjecting the frame member to grinding for removal of the frame major portion 14 at the bottom surface, the encapsulating resin 13 is ground more than the components formed of metal material because of the difference in grinding rate between the electrode constituent portion 15 and the encapsulating resin 13 and between the semiconductor element 10 and the encapsulating resin 13. This produces the state in which a surface area of the encapsulating resin 13 defined between the electrode constituent portions 15, a surface area of the encapsulating resin 13 defined between the semiconductor element 10 and the electrode constituent portion 15, and an outside surface area of the encapsulating resin 13 are all recessed to form respective depressed portions. By virtue of the provision of such depressed portions in the bottom surface of the encapsulating resin 13, the semiconductor device fabricated has such a structure that the semiconductor element and each of the external electrodes project outside the encapsulating resin's 13 surface, thereby providing a stand-off during substrate mounting. This therefore provides a semiconductor device suitable for substrate mounting.

When the bottom surface of the frame member is subjected to grinding so as to remove the frame major portion 14, this provides a structure (FIG. 9F) in which the bottom surface of the semiconductor element 10 is ground and exposed from the encapsulating resin 13 and the electrode constituent portions 15 are separated to become the individual external electrodes 11, respectively.

Figure 9G:
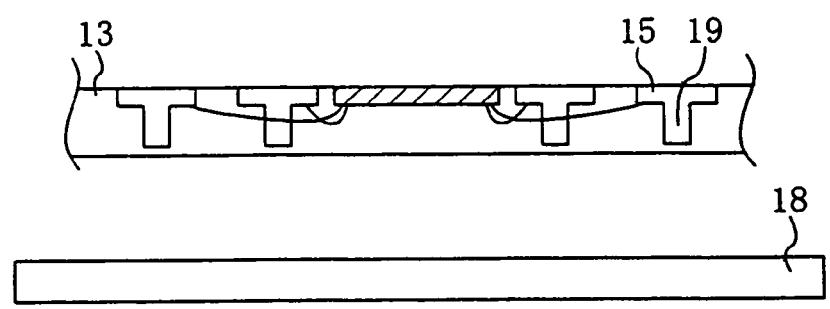

Next, as shown in FIG. 9G, the top surface side of the frame member, whose bottom surface has been ground, is subjected to grinding by the grinding member 18 in the same way as the previous grinding step. In this grinding step, grinding is carried out to such an extent that the encapsulating resin 13 on the top surface is removed and the top surface of the projected portion 19 of each electrode constituent portion 15 is exposed. In the resin encapsulation step, if resin encapsulation is carried out such that the top surface of the projected portion 19 of each electrode constituent portion 15 is exposed, this makes it possible to eliminate the grinding step.

Figure 9H:
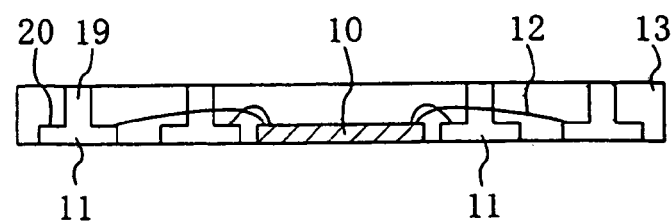

Next, as shown in FIG. 9H, division into package units for the individual semiconductor elements 10 is performed to provide extremely thin semiconductor devices of the present embodiment having an external shape of a rectangular parallelepiped. The semiconductor device, shown in FIG. 9H, is an extremely thin semiconductor device of the resin encapsulation type whose total thickness is 100 μm. More specifically, the semiconductor device of the present embodiment comprises the semiconductor element 10 having an extremely thin thickness of 50 μm, the plural external electrodes 11 disposed in a grid pattern around the periphery of the semiconductor element 10 and having the projected portion 19 which projects upward and the projecting stepped portion 20, the metal fine wire 12 for providing electrical connection between the surface of the projecting stepped portion 20 of the external electrode 11 and the surface of the semiconductor element 10, and the encapsulating resin 13 having insulative properties which encapsulates the outer peripheries of the semiconductor element 10, the external electrodes 11, and the metal fine wires 12, forming its external shape into a rectangular parallelepiped. Both the back of the semiconductor element 10 and the surface of the external electrode 11 to which the metal fine wire 12 is not connected are exposed at the bottom surface of the encapsulating resin 13 formed into a rectangular parallelepiped. The top surface of the projected portion 19 of the external electrode 11 is exposed at the top surface of the encapsulating resin 13, and the top surface level of the semiconductor element 10 and the top surface level of the projecting stepped portion 20 of the external electrode 11 are substantially the same. According to the semiconductor device of the present embodiment, the top surface of the external electrode 11 is exposed also at the top surface of the semiconductor device, thereby making it possible to provide a semiconductor device whose top and bottom surfaces each are able to act as an external electrode surface.

Embodiment 3

Figure 10:
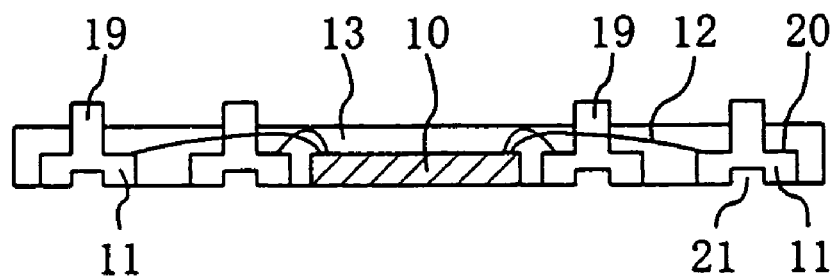
FIG. 10 schematically shows in cross section a configuration for a semiconductor device formed in accordance with a third embodiment of the present invention.
Figure 11:
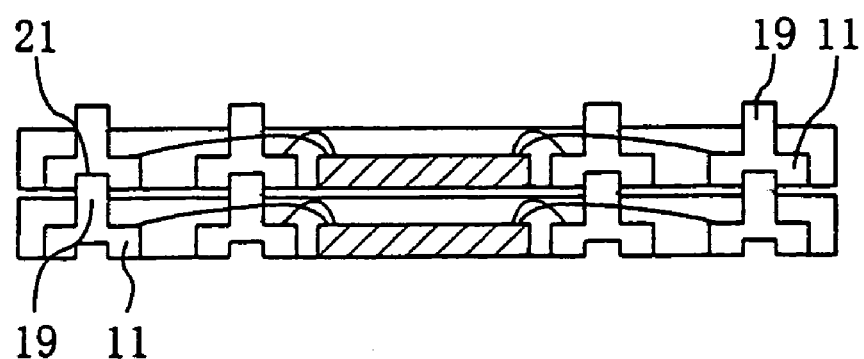
FIG. 11 schematically shows in cross section a configuration for a semiconductor device having a stackable structure.

A semiconductor device and its fabrication method in accordance with a third embodiment of the present invention will be described below. FIG. 10 schematically shows a cross-sectional configuration of the semiconductor device of the present embodiment. FIG. 11 is a cross-sectional structure diagram showing a mounting state of the semiconductor device of the present embodiment.

The semiconductor device of the present embodiment differs from the semiconductor device of the second embodiment in the following points. That is, in the present embodiment, the projected portion 19 of the external electrode 11 of the second embodiment projects from the top surface of the encapsulating resin 13 and a recessed portion 21 is formed in a bottom surface area of the external electrode 11. In order to briefly describe the present embodiment, the description will be made focusing mainly on differences between the first and second embodiments and the present embodiment and the same points as the first and second embodiments will be omitted or described in a simplified manner.

As illustrated in FIG. 10, the semiconductor device of the present embodiment has a rectangular external shape and is extremely thin. Exposed in a grid pattern at the bottom surface of the semiconductor device are the bottom surfaces of the external electrodes 11. Formed in the bottom surfaces of the external electrodes 11 are the recessed portions 21. On the other hand, the top surfaces of the external electrodes 11 (i.e., the top surfaces of the projected portions 19) are exposed at and projected from the top surface of the semiconductor device, being arranged in a grid pattern. Further, exposed at the bottom surface of the semiconductor device is the bottom surface of the semiconductor element. In accordance with the semiconductor device of the present embodiment, it is arranged such that the projected portion 19 of the external electrode 11 projects from the top surface of the semiconductor device while the recessed portion 21 is formed in the bottom surface of the external electrode 11. Accordingly, the semiconductor device of the present embodiment has a stackable structure. In other words, the bottom surface recessed portion 21 of one semiconductor device can be fit into the top-surface projected portion 19 of another semiconductor device (see FIG. 11).

Hereinafter, the semiconductor device of the present embodiment will be explained more concretely. The semiconductor device of the present embodiment includes the semiconductor element 10 having an extremely thin thickness of 50 μm, the plural external electrodes 11 disposed around the periphery of the semiconductor element 10 and each having the projected portion 19, the metal fine wire 12 for providing electrical connection between the surface of the projecting stepped portion 20 and an electrode pad (not shown) on the surface of the semiconductor element 10, and the encapsulating resin 13 having insulative properties which encapsulates the outer peripheries of the semiconductor element 10, the external electrodes 11, and the metal fine wires 12, forming its external shape into a rectangular parallelepiped. Both the back of the semiconductor element 10 and the surface of the external electrode 11 to which the metal fine wire 12 is not connected are exposed at the bottom surface of the encapsulating resin 13 which has been formed into a rectangular parallelepiped shape. The top surface of the projected portion 19 of the external electrode 11 is exposed from the top surface of the encapsulating resin 13. Further, in the semiconductor device of the present embodiment, the top surface level of the semiconductor element 10 and the top surface level of the projecting stepped portion 20 of the external electrode 11 are substantially the same. Further, in the semiconductor device of the present embodiment, the recessed portion 21 is formed in the bottom surface of the external electrode 11 to provide a stackable structure in which the top-surface projected portion 19 of another semiconductor device can be fit into that recessed portion 21.

The semiconductor device of the present embodiment is a resin-encapsulated type semiconductor device having an extremely thin total thickness of 150 μm, in which the semiconductor element 10 is formed and processed to a thickness of 50 μm. The thickness from the bottom surface of each external electrode 11 located about the periphery of the semiconductor element 10 to the top surface of the projecting stepped portion 20 is processed to the same thickness as that of the semiconductor element 10, i.e., 50 μm. Further, the distance between the top of the metal fine wire 12 connected to the top surface of the semiconductor element 10 for establishing electrical connection and the surface of the semiconductor element 10 is set below 50 μm. Accordingly, the encapsulating resin 13 located over the top surface region of the semiconductor element 10 has a thickness of 50 μm enough to cover the metal fine wire 12, and the projection amount of the projected portion 19 of the external electrode 11 as a projection amount fittable into the recessed portion 21 is about 50 μm plus the thickness of the encapsulating resin 13 on the top surface region of the semiconductor element 10, therefore achieving a semiconductor device whose total thickness is 150 μm.

Further, as shown in FIG. 11, the semiconductor device of the present embodiment can provide a stackable structure. That is, the projected portions 19 of the external electrodes 11 projecting from the top surface of one semiconductor device of the present embodiment can be fit into the recessed portions 21 of the external electrodes 11 formed in the bottom surface of another semiconductor device of the present embodiment. Because of this structure, when the semiconductor element 10 is a semiconductor memory element (a semiconductor memory chip), it is possible to mount a plurality of semiconductor memory chips on a mounting area for a single semiconductor device. This accomplishes considerably effective high-density mounting. The semiconductor element 10 may be a semiconductor memory chip in any one of the first to third embodiments or may be another type of semiconductor element.

Further, like the configuration of the semiconductor device of the first embodiment, also in the semiconductor device of the present embodiment, the depressed portions are formed in a surface area of the encapsulating resin 13 defined between the external electrodes 11, in a surface area of the encapsulating resin 13 defined between the semiconductor element 10 and the external electrode 11, and in an outside surface area of the encapsulating resin 13.

Next, a method for the fabrication of the semiconductor device of the present embodiment will be described with reference to FIG. 12, FIG. 13, and FIGS. 14A-14G.

Figure 12:
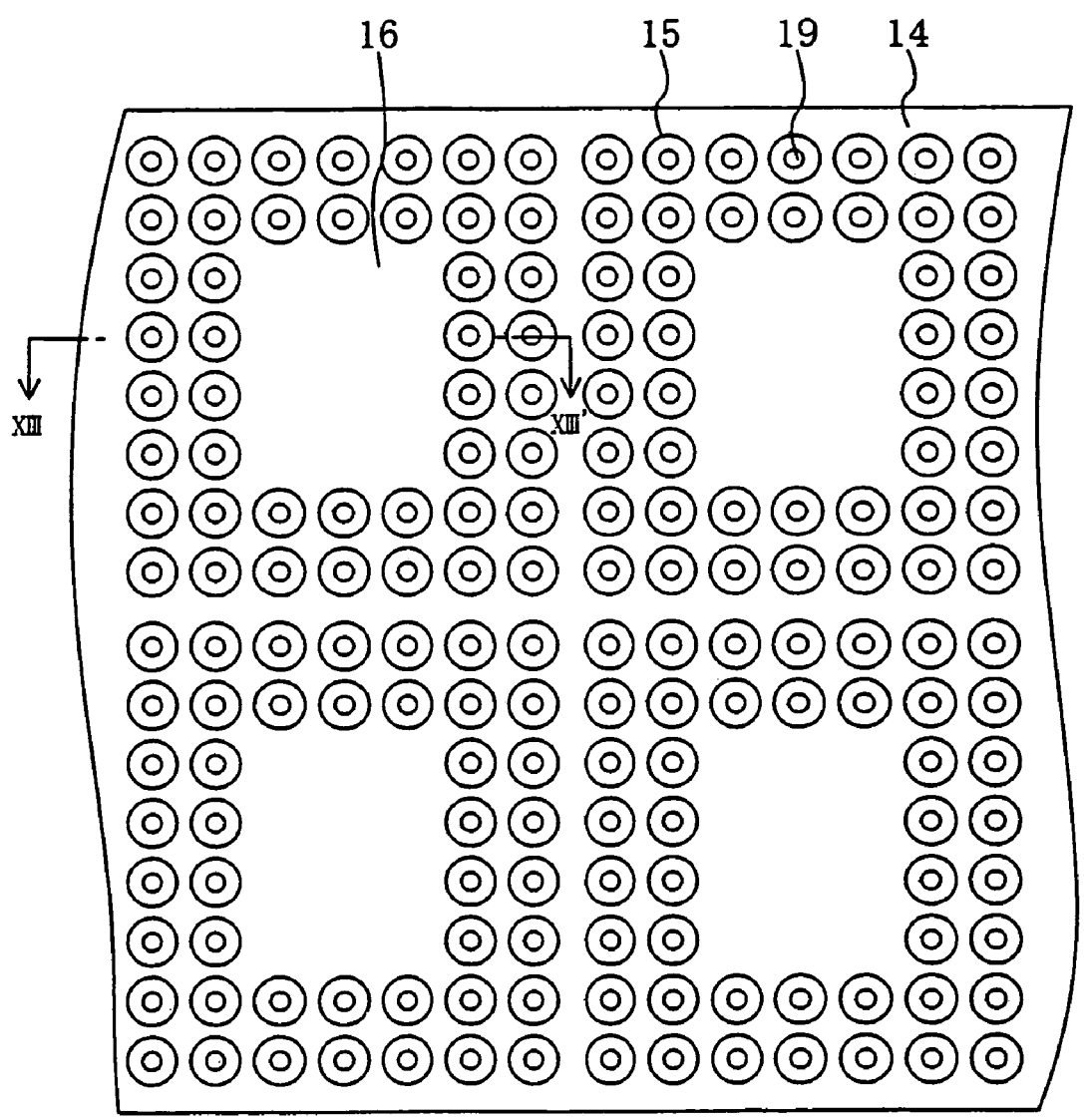
FIG. 12 is a top plan view (a plan view) showing a frame member which is used in a method for the fabrication of the semiconductor device according to the third embodiment.
Figure 13:
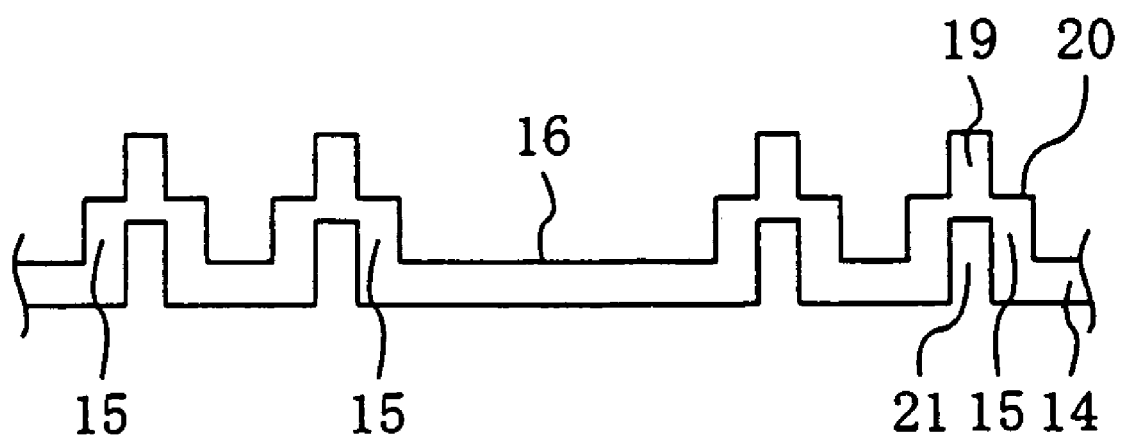
FIG. 13 is a cross-sectional view of the frame member of FIG. 12.

First of all, the frame member that is used in the semiconductor device fabrication method of the present embodiment will be explained. FIG. 12 shows a plan view of the frame member. FIG. 13 is a cross-sectional view illustrating a cross section taken on line XIII-XIII' of FIG. 12.

As shown in the figures, the frame member comprises the frame major portion 14 of a metal plate of copper, iron, et cetera, the plural electrode constituent portions 15 which are projections formed on the metal plate within the frame major portion's 14 surface, which are disposed in a corresponding manner to the electrode pitch of the semiconductor element 10, and which each have the projecting stepped portion 20 at the top and the projected portion 19, and the element housing portion 16 which is so provided as to be surrounded by the electrode constituent portions 15. As in the foregoing embodiments, the element housing portion 16 is a recessed portion defined within its surface by the projecting of the electrode constituent portions 15. Recessed portion defined between each electrode constituent portion 15 form separation regions when the electrode constituent portions 15 form the individual external electrodes 11, respectively. Further, formed in the bottom surface of the electrode constituent portion 15 is the recessed portion 21.

Further, the amount of projection of the electrode constituent portion 15 up to the top surface of the projecting stepped portion 20 is substantially the same as the thickness of the semiconductor element that is housed in the element housing portion 16. If the thickness of the semiconductor element is 250 μm, then the projection amount to the projecting stepped portion's 20 top surface is about 250 μm. Alternatively, the thickness of an element mounting adhesive which is slightly thick is taken into consideration and the projection amount, inclusive of the adhesive thickness, may be determined such that the top surface level of the projecting stepped portion 20 of the electrode constituent portion 15 and that of the semiconductor element which has been housed in the element housing portion 16 are substantially the same. The amount that the projected portion 19 projects is set not less than 50 μm.

In the present embodiment, the electrode constituent portions 15 are arranged in double disposition relating to the element housing portion 16. However, the manner of disposing the electrode constituent portions 15 and the number of the electrode constituent portions 15 can be set according to the number of electrodes of the semiconductor element that is housed in the element housing portion 16. Further, the projecting electrode constituent portions 15 are formed by etching or pressing a metal plate.

The semiconductor device of the present embodiment is fabricated in the following way by the use of the above-described frame member.

Figure 14A:
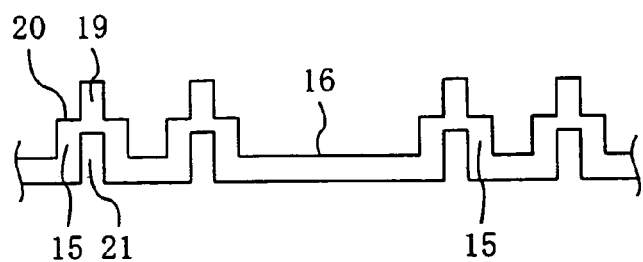
FIGS. 14A to 14G are cross-sectional views describing steps of the semiconductor device fabrication method according to the third embodiment.

As shown in FIG. 14A, the frame member is prepared which comprises the frame major portion 14 of a metal plate, the plural electrode constituent portions 15 which are projections formed on the metal plate within the frame major portion's 14 surface, which are disposed in a corresponding manner to the electrode pitch of the semiconductor element 10, which each have the projecting stepped portion 20 at the top and the projected portion 19, and which each have in the bottom surface the recessed portion 21, and the element housing portion 16 which is so provided to be surrounded by the electrode constituent portions 15.

Figure 14B:
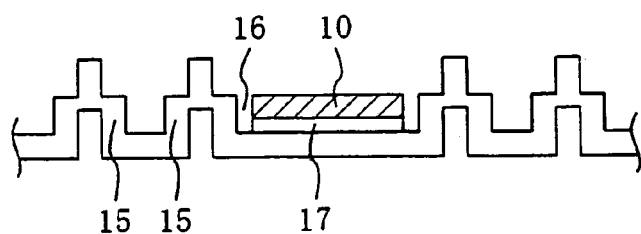

Next, as shown in FIG. 14B, the semiconductor element 10 is adhesive fixed to the element housing portion 16 by the adhesive 17, in which state the top surface level of the semiconductor element 10 and the top surface level of the projecting stepped portion 20 of the electrode constituent portion 15 are the same. Moreover, the adhesive 17 used here is either a conductive adhesive or an insulative adhesive. Any type of adhesive can be used as long as the semiconductor element 10 is fixedly affixed to the element housing portion 16. Preferably, the adhesive 17 is an adhesive whose coefficient of thermal expansion is near that of the semiconductor element 10 and that of he frame member.

Figure 14C:
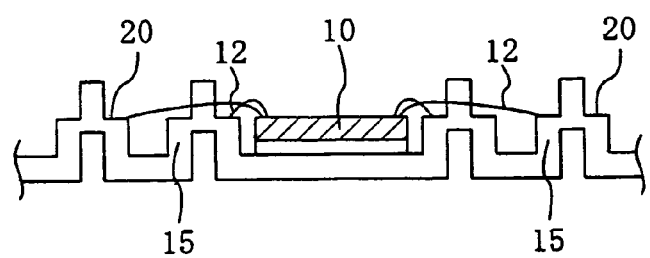

Next, as shown in FIG. 14C, an electrode (not shown) on the surface of the mounted semiconductor element 10 and the top surface of the projecting stepped portion 20 of each electrode constituent portion 15 of the frame member are electrically connected together by the metal fine wire 12. In this connection by the metal fine wire 12, the loop height is made as low as possible. As the metal fine wire 12, a gold (Au) wire or an aluminum (Al) wire usually used in wire bonding can be used. However, other than these wires, metal fine wires, whose surface is coated with insulative material so that even when the metal fine wires 12 come into contact with each other there will be produced no effect, may be used. Particularly, in the case of using a metal fine wire coated with insulative material, it is possible to provide low-loop connection, because undesirable effects, due to electrical short by contact of the metal fine wires 12 and due to contact with an end portion of the electrode constituent portion 15 or with an end portion of the semiconductor element 10, can be eliminated.

Figure 14D:
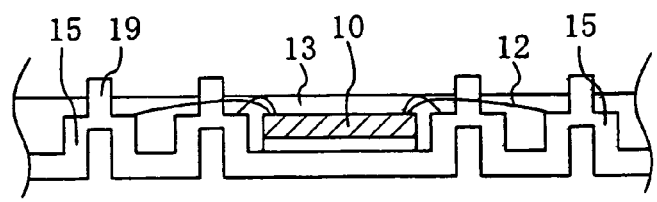

Next, as shown in FIG. 14D, the top surface side of the frame member, on which the semiconductor element 10 has been mounted and wire interconnection has been established by the metal fine wire 12, is encapsulated by the encapsulating resin 13 so that the projected portion 19 projects. In this encapsulation step, an encapsulation sheet is applied onto the top surface side of the frame member on which the semiconductor element 10 has been placed and wire interconnection has been established by the metal fine wire 12 and resin encapsulation is carried out with the projected portion 19 encroached into the encapsulation sheet, wherein a structure in which the projected portion 19 projects from the resin-encapsulated surface.

Further, in this single-side encapsulation, encapsulation is carried out so that the head top portion of the low-loop connected metal fine wire 12 is covered with the encapsulating resin 13, the top surface of the semiconductor element 10 is encapsulated for a thickness of 50 μm, and the projected portion 19 of the electrode constituent portion 15 projects for about 50 μm. As the encapsulating resin 13, a resin having insulative properties (for example, a thermo-setting resin such as an epoxy resin) is used and a non-permeable resin or a permeable resin may be used. The use of a permeable resin as a material to form the encapsulating resin 13 makes it possible to confirm a post-encapsulation inside state, and if the permeable resin is a photo-curing resin, this makes it possible to allow the resin to harden by ultraviolet radiation.

The use of a processed encapsulation die in the encapsulation step makes it possible for the projected portion 19 to project from the encapsulating resin surface.

Figure 14E:
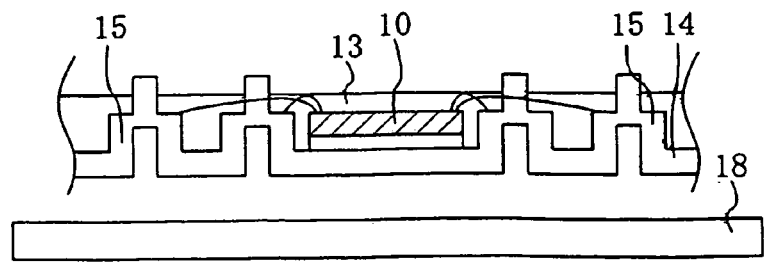

Next, as shown in FIG. 14E, the frame member, which has undergone resin encapsulation, is subjected to grinding. More specifically, the frame major portion 14 at the bottom surface of the frame member is subjected to grinding by a grinding member 18 such as a grinder. In this grinding step, the thickness of the entire frame member is made thin by grinding from the side of the bottom surface of the frame member. The frame member is ground to such an extent that the frame major portion 14 at the bottom surface is removed, the electrode constituent portions 15 are separated from each other, the bottom surface of the semiconductor element 10 is exposed, and the encapsulating resin 13 is exposed between electrode constituent portions 15 and between the semiconductor element 10 and an electrode constituent portion 15. In the present embodiment, the semiconductor element 10 is ground to a thickness of 50 μm.

As in the first and second embodiments, it is preferable that the grinding member 18 be an elastic grinding member. In the case the grinding member 18 is an elastic grinding member, when subjecting the frame member to grinding for removal of the frame major portion 14 at the bottom surface, the encapsulating resin 13 is ground more than the components formed of metal material because of the difference in grinding rate between the electrode constituent portion 15 and the encapsulating resin 13 and between the semiconductor element 10 and the encapsulating resin 13. This produces the state in which a surface area of the encapsulating resin 13 defined between the electrode constituent portions 15, a surface area of the encapsulating resin 13 defined between the semiconductor element 10 and the electrode constituent portion 15, and an outside surface area of the encapsulating resin 13 are all recessed to form respective depressed portions. By virtue of the provision of such depressed portions in the bottom surface of the encapsulating resin 13, the semiconductor device fabricated has such a structure that the semiconductor element and each of the external electrodes project outside the encapsulating resin's 13 surface, thereby providing a stand-off during substrate mounting. This therefore provides a semiconductor device suitable for substrate mounting.

When the bottom surface of the frame member is subjected to grinding so as to remove the frame major portion 14, this provides a structure (FIG. 14F) in which the bottom surface of the semiconductor element 10 is ground and exposed from the encapsulating resin 13 and the electrode constituent portions 15 are separated to become the individual external electrodes 11, respectively. Each of the external electrodes 11 has the recessed portion 21 and the projected portion 19 at the bottom surface and at the top surface, respectively.

Figure 14F:
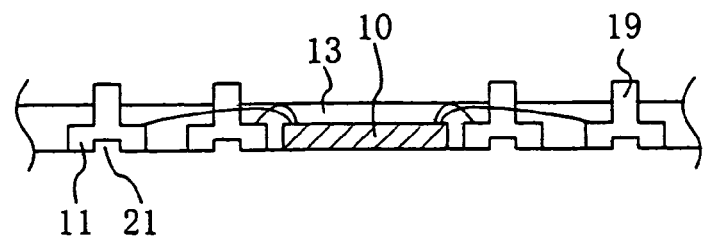
Figure 14G:
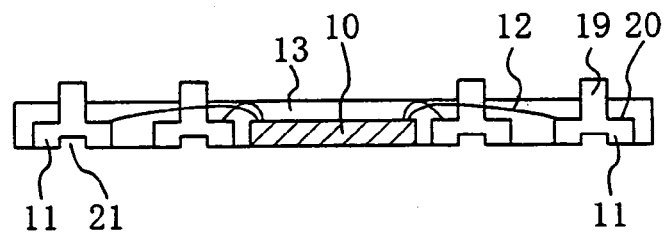
Figure 15:
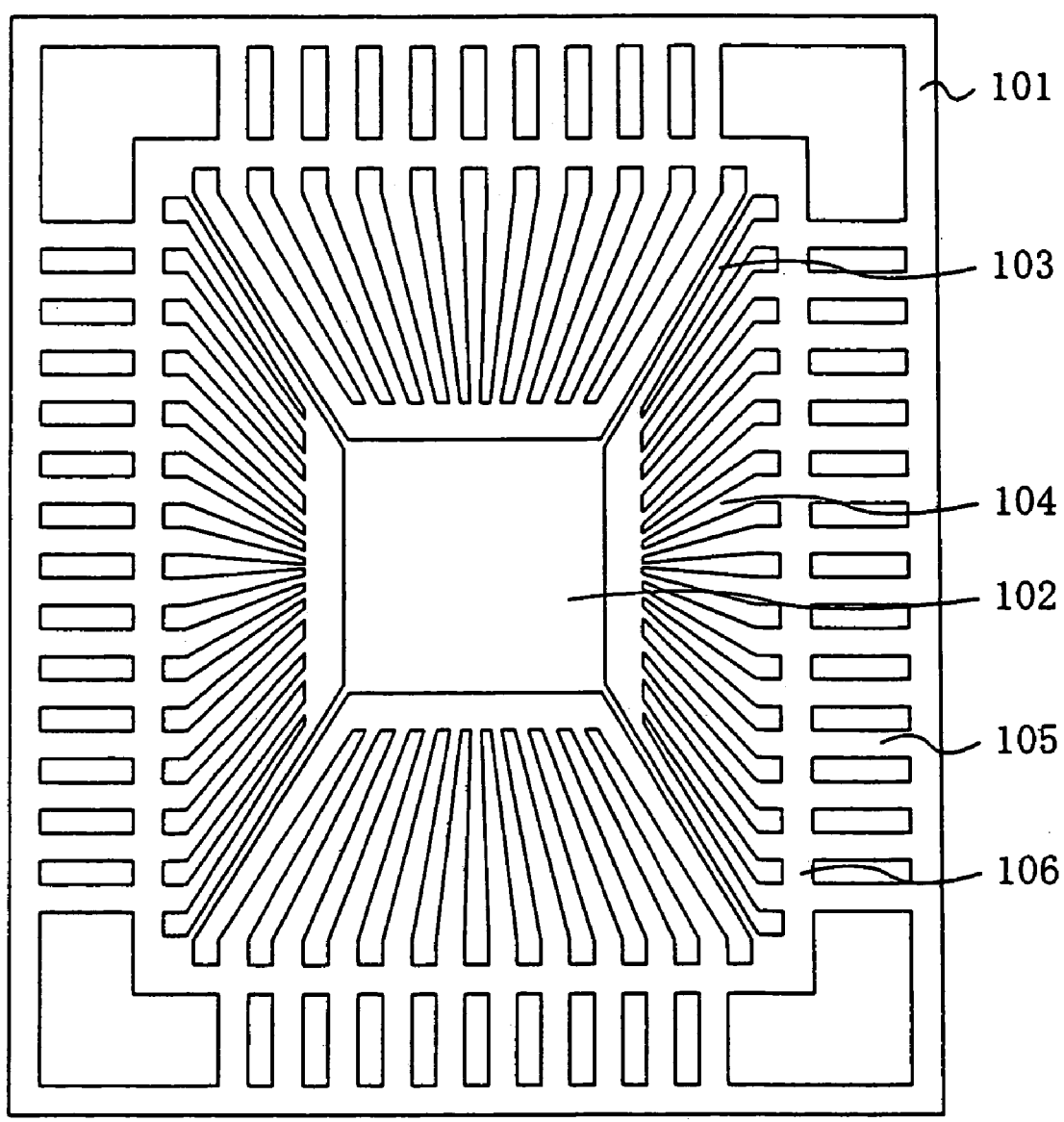
FIG. 15 is a plan view showing a lead frame as known in the prior art.
Figure 16:
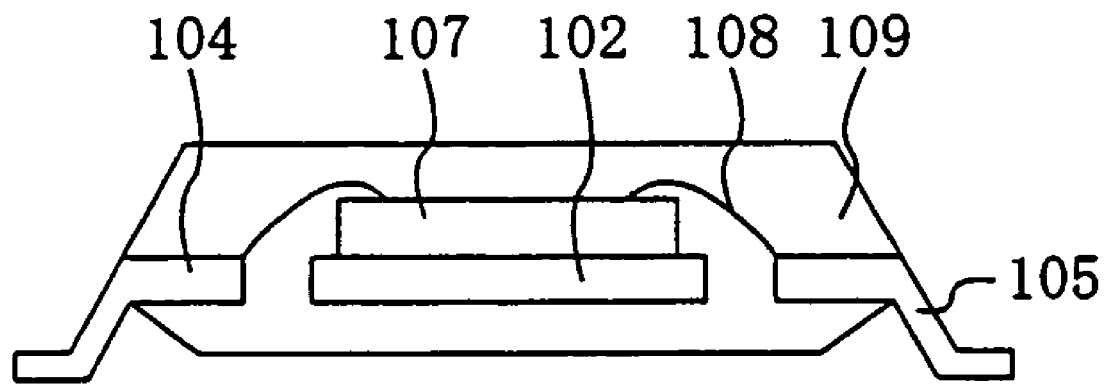
FIG. 16 schematically shows in cross section a structure for a resin-encapsulated type semiconductor device as known in the prior art.
Figure 17:
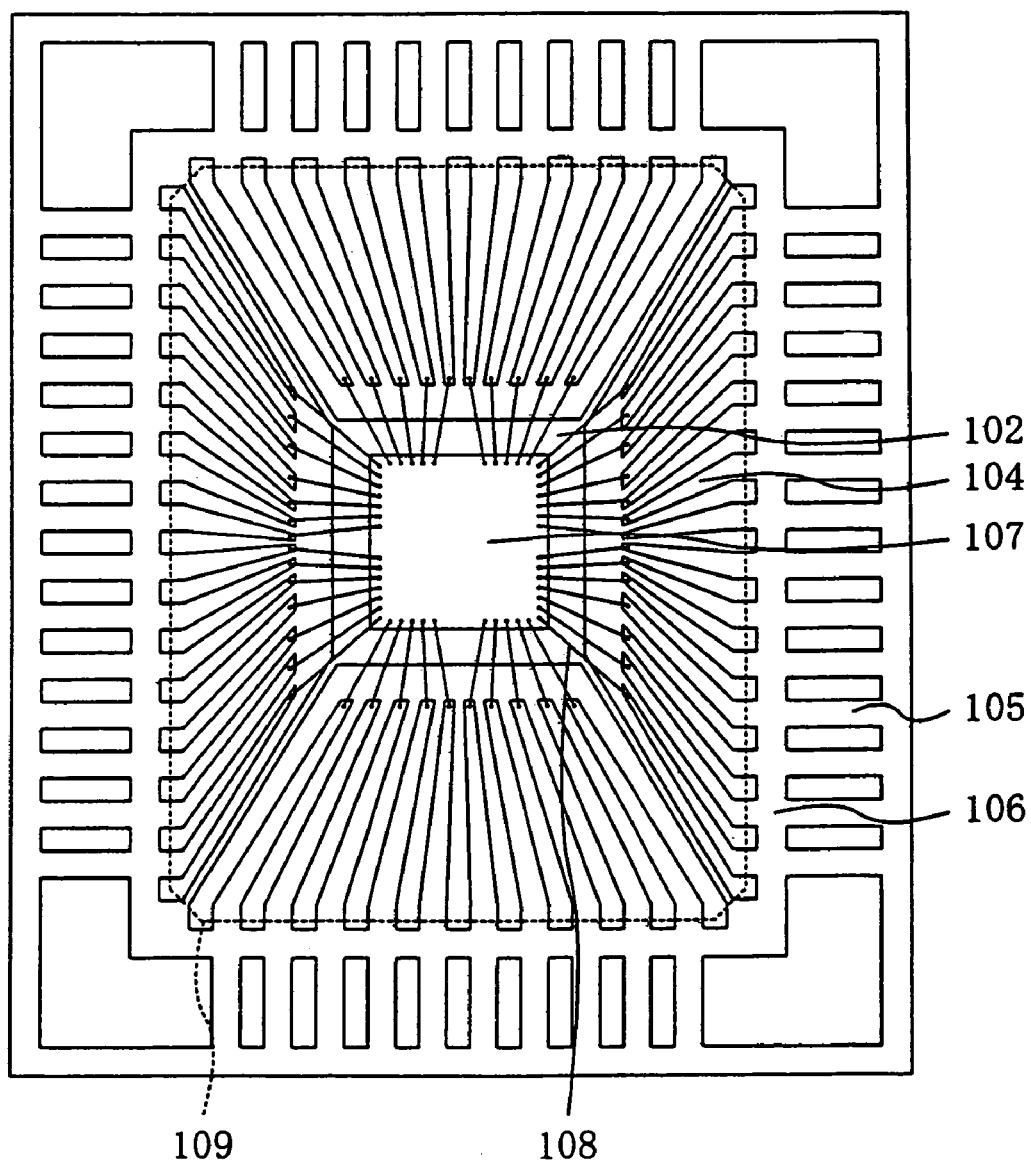
FIG. 17 is a plan view describing a method for the fabrication of a resin-encapsulated type semiconductor device as known in the prior art.

Next, as shown in FIG. 14G, division into package units for the individual semiconductor elements 10 is performed to provide extremely thin semiconductor devices of the present embodiment having an external shape of a rectangular parallelepiped. The semiconductor device, shown in FIG. 14G, is an extremely thin semiconductor device of the resin encapsulation type whose total thickness is 150 µm. More specifically, the semiconductor device of the present embodiment includes the semiconductor element 10 having an extremely thin thickness of 50 µm, the plural external electrodes 11 disposed in a grid pattern around the periphery of the semiconductor element 10 and each having the projected portion 19 which projects upward and the projecting stepped portion 20, the metal fine wire 12 for providing electrical connection between the surface of the projecting stepped portion 20 of the external electrode 11 and the surface of the semiconductor element 10, and the encapsulating resin 13 having insulative properties which encapsulates the outer peripheries of the semiconductor element 10, the external electrodes 11, and the metal fine wires 12, forming its external shape into a rectangular parallelepiped. Both the back of the semiconductor element 10 and the surface of the external electrode 11 to which the metal fine wire 12 is not connected are exposed at the bottom surface of the encapsulating resin 13 which has been formed into a rectangular parallelepiped, the top surface of the projected portion 19 of the external electrode 11 is exposed at the top surface of the encapsulating resin 13, and the top surface level of the semiconductor element 10 and the top surface level of the projecting stepped portion 20 of the external electrode 11 are substantially the same.

Further, in the state of FIG. 14F, in other words, prior to the state of FIG. 14G, an arrangement may be made in which the projected portions 19 of the external electrodes 11 projecting from the top surface of one semiconductor device of the present embodiment are fit into their corresponding recessed portions 21 of the external electrodes 11 formed in the bottom surface of another semiconductor device of the present embodiment. This arrangement provides a stacked structure and it is possible to perform division into individual laminated modules. According to this method, it is possible to fabricate semiconductor devices of the laminated type at high efficiency. This method is effective for the case where the semiconductor element is a memory element, and extremely thin memory modules can be fabricated.

The extremely thin semiconductor device of the present embodiment is realized as follows. A semiconductor element is mounted on a frame member having electrode constituent portions projecting in its surface, and after wire interconnection and resin encapsulation steps, grinding is carried out from the frame bottom surface side to make the semiconductor element thinner, and the electrode constituent portions are separated to become individual external electrodes, thereby realizing an extremely thin semiconductor device. As described in each of the embodiments of the present invention, by making various changes in electrode constituent portion structure, it becomes possible to obtain external electrode forms and thin semiconductor devices capable of being mounted in a laminated fashion.

In the embodiments of the present invention, the external electrodes have the structure of shape made of line in cross section. However, the external electrode structure may be formed into a reversed taper shape, a grooved shape, a recessed shape, or a projected shape for the anchor effect with encapsulating resin and for stress measurements. Alternatively, ball electrodes such as solder balls may be formed in the bottom surface of the external electrode exposed from the encapsulating resin.

In accordance with the semiconductor device of the present invention, both the bottom surface of the semiconductor element and the bottom surface of the external electrode are exposed from the bottom surface of the encapsulating resin, and the top surface of the semiconductor element and the top surface of the external electrode are located substantially coplanar with each other, thereby achieving an extremely thin semiconductor device structure. Moreover, the external electrodes are surface-disposed in two dimensions, thereby providing a semiconductor device configuration fully capable of coping with the multipinization. Furthermore, for the case of a semiconductor device configuration in which a semiconductor device is provided with an external electrode having a projected portion and the projected portion is exposed from the top surface of the encapsulating resin, it is possible to make both the bottom and top surfaces of the semiconductor device serve as an external electrode surface. In addition, for the case of a semiconductor device configuration in which a semiconductor device is provided with an external electrode having a projected portion at the top and a recessed portion at the bottom surface and the projected portion is projected from the top surface of the encapsulating resin while the recessed portion is exposed from the bottom surface of the encapsulating resin, it is possible to provide a stackable semiconductor device.

Further, the semiconductor device fabrication method of the present invention makes it possible to provide a novel method in which a semiconductor element is placed on a frame member and subjected to wire interconnection and encapsulation and thereafter the frame member is ground from its bottom surface side. In this method, the frame member is removed for division into individual external electrodes and the semiconductor element and the external electrode are reduced in thickness. As a result, it is possible to provide a semiconductor device whose total thickness is extremely thin.

What is claimed is:

1. A method for the fabrication of a semiconductor device comprising the steps of:
(a) preparing a frame member;
said frame member including:
a plate-like frame major portion having a top surface and a bottom surface;
a plurality of electrode constituent portions which are projections formed on said top surface of said frame major portion, each of said plural electrode constituent portions having at its top surface a projecting stepped portion and a projected portion and in its bottom surface a recessed portion; and an element housing portion located in a top surface area of said frame major portion surrounded by said plural electrode constituent portions, said element housing portion housing therein a semiconductor element to be fixed thereto;

(b) fixing said semiconductor element having a plurality of electrodes to said element housing portion of said frame member;

(c) after said step (b), electrically connecting by a fine wire between at least one of said plural electrodes of said semiconductor element and a top surface of at least one of said projecting stepped portions of said plural electrode constituent portions;

(d) encapsulating, by a resin, a surface of said frame member on the side where said semiconductor element has been fixed to said element housing portion and has been electrically connected by said fine wire such that at least a top surface of each of said projected portions of said plural electrode constituent portions projects; and (e) after said step (d), grinding said frame major portion of said frame member such that said plural electrode constituent portions are separated from each other to become individual external electrodes each having at its bottom surface said recessed portion, and exposing both a bottom surface of each of said plural external electrodes and a bottom surface of said semiconductor element from said resin.

2. The method of claim 1, wherein said frame member prepared in said step (a) includes a plurality of said element housing portions;

wherein said step (b) is a step of fixing a plurality of said semiconductor elements to said plural element housing portions, respectively; and wherein said method further comprises after said step (e):

a step of forming a stacked structure by fitting said recessed portion in said bottom surface of said external electrode into a projected portion of a different semiconductor device, said projected portion being formed on an external electrode of said different semiconductor device so as to correspond to said recessed portion;

after said stacked structure formation step, a step of dividing said plural semiconductor elements in a stacked structure state into individual lamination type semiconductor devices, respectively.

* * * * *